US012615844B2

(12) United States Patent
Moon et al.

(10) Patent No.: US 12,615,844 B2
(45) Date of Patent: Apr. 28, 2026

(54) THIN FILM TRANSISTOR, TRANSISTOR ARRAY SUBSTRATE, AND METHOD FOR FABRICATING THE TRANSISTOR ARRAY SUBSTRATE

(71) Applicant: Samsung Display Co., LTD., Yongin-si (KR)

(72) Inventors: Sung Gwon Moon, Yongin-si (KR); Dong Han Kang, Yongin-si (KR); Jee Hoon Kim, Yongin-si (KR); Seung Sok Son, Yongin-si (KR); Shin Hyuk Yang, Yongin-si (KR); Woo Geun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 376 days.

(21) Appl. No.: 18/208,263

(22) Filed: Jun. 10, 2023

(65) Prior Publication Data

US 2024/0120342 A1     Apr. 11, 2024

(30) Foreign Application Priority Data

Oct. 6, 2022     (KR) ........................ 10-2022-0128194
Dec. 15, 2022     (KR) ........................ 10-2022-0175981

(51) Int. Cl.
*H01L 27/12*          (2006.01)
*H10D 86/01*          (2025.01)
(Continued)

(52) U.S. Cl.
CPC ......... *H10D 86/60* (2025.01); *H10D 86/0221* (2025.01); *H10D 86/423* (2025.01); *H10D 86/443* (2025.01); *H10D 86/481* (2025.01)

(58) Field of Classification Search
CPC .... H10D 86/60; H10D 86/0221; H10D 86/01; H10D 86/423; H10D 86/40;
(Continued)

(56) References Cited

U.S. PATENT DOCUMENTS 9,136,388 B2 *   9/2015   Yamazaki .......... H10D 30/6755
9,261,746 B2 *   2/2016   Uchida ............. G02F 1/136213
(Continued)

FOREIGN PATENT DOCUMENTS

KR          1020020096743          12/2002
KR          100488958          5/2005
(Continued)

OTHER PUBLICATIONS

International Search Report—PCT/KR2023/007675 dated Sep. 14, 2023, citing references listed within.

*Primary Examiner* — Nikolay K Yushin
(74) *Attorney, Agent, or Firm* — CANTOR COLBURN LLP

(57) ABSTRACT

A transistor array substrate includes a substrate, an active layer disposed on the substrate and including a channel region, a source region and a drain region, a gate insulating layer disposed on a part of the active layer, a gate electrode overlapping the channel region of the active layer and included in an electrode conductive layer which is disposed on the gate insulating layer, a source electrode included in the electrode conductive layer and in contact with a part of the source region of the active layer, and a drain electrode included in the electrode conductive layer and in contact with a part of the drain region of the active layer. The active layer includes an oxide semiconductor including crystals and is disposed as an island shape excluding a hole in a plan view.

25 Claims, 27 Drawing Sheets

BCDL: LSL, VDL, PDL1
ECDL: GE, SE, DE, PDL2

(51) Int. Cl.
　　*H10D 86/40*　　　　(2025.01)
　　*H10D 86/60*　　　　(2025.01)

(58) Field of Classification Search
　　CPC .. H10D 86/443; H10D 86/481; H10D 86/441;
　　　　　　H10D 30/6755; H10D 30/67; H10D
　　　　　　30/6723; H10K 59/123; H10K 59/131
　　See application file for complete search history.

(56)　　　　　　　References Cited

U.S. PATENT DOCUMENTS

| | | | | |
|---|---|---|---|---|
| 11,177,449 | B2 * | 11/2021 | Sung | H10D 30/6755 |
| 11,984,453 | B2 * | 5/2024 | Wang | G02F 1/136209 |
| 12,369,357 | B2 * | 7/2025 | Kim | H10D 62/80 |
| 2013/0020571 | A1 * | 1/2013 | Yamazaki | H10D 30/6755 |
| | | | | 257/43 |
| 2014/0176845 | A1 * | 6/2014 | Uchida | G02F 1/136227 |
| | | | | 438/30 |
| 2020/0194699 | A1 * | 6/2020 | Sung | H10K 71/10 |
| 2023/0077265 | A1 * | 3/2023 | Kim | H10D 99/00 |
| 2023/0127842 | A1 * | 4/2023 | Kang | H10D 30/6757 |
| | | | | 257/43 |
| 2023/0154933 | A1 * | 5/2023 | Wang | G02F 1/1368 |
| | | | | 349/33 |

FOREIGN PATENT DOCUMENTS

| | | |
|---|---|---|
| KR | 1020060062139 | 6/2006 |
| KR | 1020090072099 | 7/2009 |
| KR | 101229415 | 2/2013 |
| KR | 1020160001879 | 1/2016 |
| KR | 1020210126187 | 10/2021 |
| KR | 1020220077235 | 6/2022 |

* cited by examiner

FIG. 3
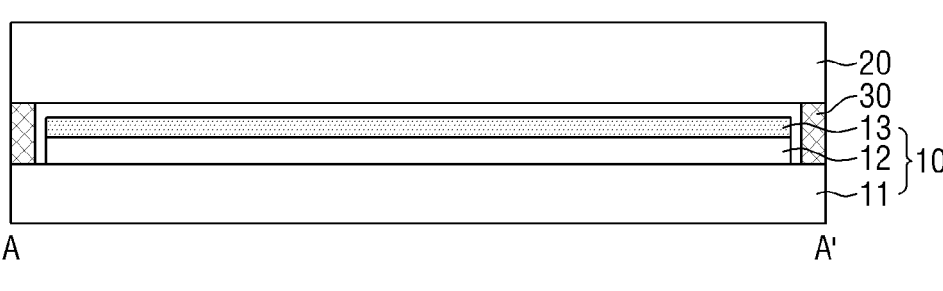
DR3

FIG. 8

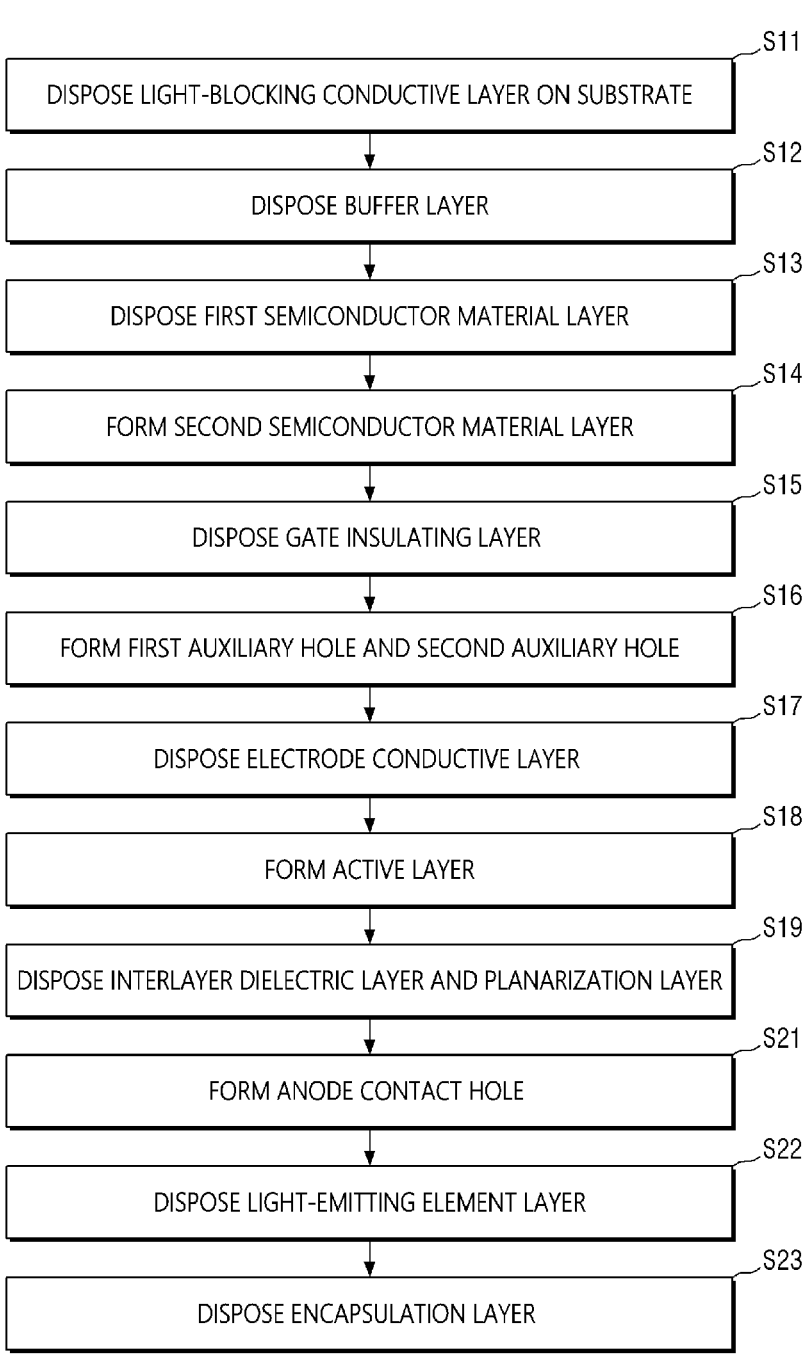

S11
DISPOSE LIGHT-BLOCKING CONDUCTIVE LAYER ON SUBSTRATE

S12
DISPOSE BUFFER LAYER

S13
DISPOSE FIRST SEMICONDUCTOR MATERIAL LAYER

S14
FORM SECOND SEMICONDUCTOR MATERIAL LAYER

S15
DISPOSE GATE INSULATING LAYER

S16
FORM FIRST AUXILIARY HOLE AND SECOND AUXILIARY HOLE

S17
DISPOSE ELECTRODE CONDUCTIVE LAYER

S18
FORM ACTIVE LAYER

S19
DISPOSE INTERLAYER DIELECTRIC LAYER AND PLANARIZATION LAYER

S21
FORM ANODE CONTACT HOLE

S22
DISPOSE LIGHT-EMITTING ELEMENT LAYER

S23
DISPOSE ENCAPSULATION LAYER

BCDL: LSL, VDL

BCDL: LSL, VDL

BCDL: LSL, VDL

BCDL: LSL, VDL

BCDL: LSL, VDL

BCDL: LSL, VDL
ECDL: GE, SE, DE, PDL2

BCDL: LSL, VDL
ECDL: GE, SE, DE
SEL: ACT, CPE

BCDL: LSL, VDL, PDL1
ECDL: GE, SE, DE, PDL2

BCDL: LSL, VDL
ECDL: GE, SE, DE, PDL2

BCDL: LSL, VDL
ECDL: GE, SE, DE
SEL: ACT, CPE

BCDL: LSL, VDL

BCDL: LSL, VDL
ECDL: GE, SE, DE
SEL: ACT, CPE

BCDL: LSL, VDL

THIN FILM TRANSISTOR, TRANSISTOR ARRAY SUBSTRATE, AND METHOD FOR FABRICATING THE TRANSISTOR ARRAY SUBSTRATE

This application claims priority to Korean Patent Application No. 10-2022-0128194, filed on Oct. 6, 2022, and Korean Patent Application No. 10-2022-0175981, filed on Dec. 15, 2022, and all the benefits accruing therefrom under 35 U.S.C. § 119, the contents of which in their entireties are herein incorporated by reference.

BACKGROUND

1. Field

The disclosure relates to a thin-film transistor, a transistor array substrate, and a method for fabricating the transistor array substrate.

2. Description of the Related Art

As the information-oriented society evolves, display devices are widely used in various fields. For example, display devices are being employed by a variety of electronic devices such as smart phones, digital cameras, laptop computers, navigation devices, and smart televisions.

The display device may include a display panel that emits light for displaying images, and a driver that supplies a signal or power for driving the display panel.

A display panel may include a display area in which light for displaying images is output, and may include a polarizing member or a light-emitting member disposed in the display area.

Sub-pixels may be arranged in the display area, which output lights with respective luminances and colors.

In addition, the display panel may include a transistor array substrate that includes a substrate, and a circuit layer disposed on the substrate and including pixel drivers associated with the sub-pixels, respectively. With such a transistor array substrate, lights can be output with respective luminances and colors from the sub-pixels in the display area.

Each of the pixel drivers of the transistor array substrate may include at least one thin-film transistor.

A thin-film transistor includes a gate electrode, a source electrode, a drain electrode, and an active layer. Such a thin-film transistor may be a switching element in which electric current flows through a channel region of the active layer if a voltage difference between the gate electrode and the source electrode is greater than a threshold value by a driving signal transmitted to the gate electrode.

SUMMARY

As the number of mask processes increases in the process of fabricating a transistor array substrate including thin-film transistors, the fabrication cost may increase while the yield may decrease.

In a case where the number of mask processes is reduced, the elements of the thin-film transistors may not be fabricated via mask processes suitable for their own characteristics. As a result, the elements of the thin-film transistors may not be fabricated as designed, and accordingly the reliability and the uniformity of current characteristics of the thin-film transistors may be deteriorated.

Embodiments of the disclosure provide a thin-film transistor that can be fabricated via a smaller number of mask processes without compromising the reliability and the uniformity of current characteristics, a transistor array substrate including the thin-film transistor, and a method of fabricating the transistor array substrate.

According to an embodiment, a thin-film transistor includes a substrate; an active layer disposed on the substrate and including a channel region, a source region connected to one side of the channel region, and a drain region connected to an opposite side of the channel region; a gate insulating layer disposed on a part of the active layer; a gate electrode overlapping with the channel region of the active layer and included in an electrode conductive layer which is disposed on the gate insulating layer; a source electrode included in the electrode conductive layer and in contact with a part of the source region of the active layer; and a drain electrode included in the electrode conductive layer and in contact with a part of the drain region of the active layer. In such an embodiment, the active layer includes an oxide semiconductor including crystals and is disposed as an island shape excluding a hole in a plan view.

In an embodiment, the active layer comprises a first gap area between the source electrode and the gate electrode, and a second gap area between the drain electrode and the gate electrode. In such an embodiment, the first gap area and the second gap area may be integrally formed with the channel region as a single unitary and indivisible part.

In an embodiment, the active layer may be disposed on a buffer layer covering the substrate, and the gate electrode, the source electrode and the drain electrode may be covered with an interlayer dielectric layer. In such an embodiment, entire of the first gap area and entire of the second gap area may be in contact with the interlayer dielectric layer and disposed between the interlayer dielectric layer and the buffer layer.

In an embodiment, at least a part of the active layer except for the channel region may have conductivity.

In an embodiment, each of the first gap area and the second gap area may have conductivity.

In an embodiment, the electrode conductive layer may include a first metal layer disposed on the gate insulating layer and including titanium (Ti); a second metal layer disposed on the first metal layer and including a metal material having a resistance lower than a resistance of titanium (Ti); and a third metal layer disposed on the second metal layer and including indium tin oxide (ITO).

According to an embodiment, a transistor array substrate may include a substrate including a display area in which sub-pixels are arranged and a non-display area around the display area; and a circuit layer disposed on the substrate and including pixel drivers associated with the sub-pixels, respectively. In such an embodiment, each of the pixel drivers includes a thin-film transistor in the circuit layer, and the thin-film transistor includes an active layer disposed on the substrate and including a channel region, a source region connected to one side of the channel region, and a drain region connected to an opposite side of the channel region; a gate insulating layer disposed on a part of the active layer; a gate electrode overlapping the channel region of the active layer and included in an electrode conductive layer which is disposed on the gate insulating layer; a source electrode included in the electrode conductive layer and in contact with a part of the source region of the active layer; and a drain electrode included in the electrode conductive layer and in contact with a part of the drain region of the active layer. In such an embodiment, the active layer includes an oxide semiconductor including crystals and is disposed as an island shape excluding a hole in a plan view.

In an embodiment, the active layer comprises a first gap area between the source electrode and the gate electrode, and a second gap area between the drain electrode and the gate electrode. In such an embodiment, the first gap area and the second gap area may be integrally formed with the channel region as a single unitary and indivisible part.

In an embodiment, the circuit layer may further include a light-blocking electrode overlapping at least the channel region of the active layer and included in a light-blocking conductive layer which is disposed on the substrate; a buffer layer disposed on the substrate and covering the light-blocking conductive layer; an interlayer dielectric layer disposed on the buffer layer and covering the thin-film transistor; and a planarization layer disposed on the interlayer dielectric layer. In such an embodiment, entire of the first gap area and entire of the second gap area may be in contact with the interlayer dielectric layer and disposed between the interlayer dielectric layer and the buffer layer.

In an embodiment, at least a part of the active layer except for the channel region has conductivity.

In an embodiment, each of the first gap area and the second gap area has conductivity.

In an embodiment, the electrode conductive layer may include a first metal layer disposed on the gate insulating layer and including titanium (Ti); a second metal layer disposed on the first metal layer and including a metal material having a resistance lower than a resistance of titanium (Ti); and a third metal layer disposed on the second metal layer and including indium tin oxide (ITO).

In an embodiment, the circuit layer may further include a signal pad disposed in a part of the non-display area. In such an embodiment, the signal pad may include a first pad layer disposed in a same layer as the light-blocking conductive layer; and a second pad layer disposed in a same layer as the electrode conductive layer and electrically connected to the first pad layer.

In an embodiment, the transistor array substrate may further include a light-emitting element layer disposed on the circuit layer and including light-emitting elements electrically connected to the pixel drivers, respectively. In such an embodiment, the circuit layer may further include a scan gate line which transmits a scan signal to the pixel drivers; a data line which transmits a data signal to the pixel drivers; and an initialization voltage line which transmits an initialization voltage to the pixel drivers. In such an embodiment, one of the pixel drivers may include a first thin-film transistor connected in series with one of the light-emitting elements between a first supply voltage line and a second supply voltage line which respectively which transmit a first supply voltage and a second supply voltage for driving the light-emitting elements; a second thin-film transistor electrically connected between the data line and a gate electrode of the first thin-film transistor and turned on in response to the scan signal of the scan gate line; a pixel capacitor electrically connected between a first node and a second node, where the first node is connected between the gate electrode of the first thin-film transistor and the second thin-film transistor, and the second node is connected between the first thin-film transistor and the light-emitting element; and a third thin-film transistor electrically connected between the initialization voltage line and the second node and turned on in response to an initialization control signal of an initialization gate line.

In an embodiment, the first supply voltage line may be included in the light-blocking conductive layer. In such an embodiment, one of the source electrode and the drain electrode of the first thin-film transistor may be electrically connected to the first supply voltage line through a first electrode connection hole defined through the gate insulating layer and the buffer layer, and the other of the source electrode and the drain electrode of the first thin-film transistor may be electrically connected to the light-blocking electrode through a second electrode connection hole defined through the gate insulating layer and the buffer layer.

In an embodiment, the light-emitting element may include an anode electrode disposed on the planarization layer and electrically connected to the first thin-film transistor through an anode contact hole defined through the planarization layer and the interlayer dielectric layer.

In an embodiment, the circuit layer may further include a capacitor electrode disposed in a same layer as the active layer and electrically connected to the gate electrode of the first thin-film transistor, and portions of the capacitor electrode and the light-blocking electrode overlapping each other may define the pixel capacitor.

According to an embodiment, a method of fabricating a transistor array substrate includes disposing a first semiconductor material layer including an oxide semiconductor in an amorphous phase on a substrate; performing heat treatment on the first semiconductor material layer to form a second semiconductor material layer in a crystalline phase by the heat treatment; disposing a gate insulating layer covering the second semiconductor material layer on the substrate; partially removing the gate insulating layer to form a first auxiliary hole and a second auxiliary hole adjacent to opposing ends of the second semiconductor material layer, respectively; disposing an electrode conductive layer on the gate insulating layer; and forming an active layer by partially removing the gate insulating layer and making a part of the second semiconductor material layer conductive using the electrode conductive layer as a mask.

In an embodiment, the performing the heat treatment on the first semiconductor material layer may include performing the heat treatment at a temperature between about 300 degrees Celsius and about 450 degrees Celsius.

In an embodiment, the partially removing the gate insulating layer may include using an etching material including fluorine (F). In such an embodiment, an etch rate of the second semiconductor material layer for the etching material including fluorine (F) may be lower than an etch rate of the first semiconductor material layer, and the active layer may be disposed as an island shape excluding a hole in a plan view after the forming the active layer.

In an embodiment, the disposing the electrode conductive layer may include sequentially disposing a first metal layer including titanium (Ti), a second metal layer including a metal material having a lower resistance than the first metal layer, and a third metal layer including indium tin oxide (ITO) on the gate insulating layer; and forming the electrode conductive layer by partially removing a stack of the first metal layer, the second metal layer and the third metal layer. In such an embodiment, the partially removing the stack of the first metal layer, the second metal layer and the third metal layer may include using the etching material including fluorine (F).

In an embodiment, after the first auxiliary hole and the second auxiliary hole are formed, a first contact assist portion and a second contact assist portion of the second semiconductor material layer which are exposed through the first auxiliary hole and the second auxiliary hole, respectively, may be in contact with the etching material and become conductive.

In an embodiment, the electrode conductive layer may include a gate electrode overlapping a part of a central portion of the second semiconductor material layer, a source electrode overlapping one side of the second semiconductor material layer, and a drain electrode overlapping an opposite side of the second semiconductor material layer. In such an embodiment, the source electrode may be in contact with the first contact assist portion of the second semiconductor material layer through the first auxiliary hole, and the drain electrode may be in contact with the second contact assist portion of the second semiconductor material layer through the second auxiliary hole.

In an embodiment, the forming the active layer may include making conductive remaining parts of the second semiconductor material layer that are not covered with the gate insulating layer. In such an embodiment, the active layer may include a channel region overlapping the gate electrode, a source region in contact with one side of the channel region, and a drain region in contact with an opposite side of the channel region, the source region may include the first contact assist portion, and the drain region may include the second contact assist portion.

In an embodiment, the method may further include disposing a buffer layer covering a light-blocking conductive layer on the substrate prior to the disposing the first semiconductor material layer; and disposing an interlayer dielectric layer covering the electrode conductive layer and the active layer after the forming the active layer. In such an embodiment, the active layer comprises a first gap area between the source electrode and the gate electrode, and a second gap area between the drain electrode and the gate electrode. In such an embodiment, entire of the first gap area and entire of the second gap area may be in contact with the interlayer dielectric layer and disposed between the interlayer dielectric layer and the buffer layer after the disposing the interlayer dielectric layer.

According to an embodiment of the disclosure, a thin-film transistor includes an active layer on a substrate, a gate insulating layer disposed on a part of the active layer, and a gate electrode, a source electrode and a drain electrode, each included in or defined by an electrode conductive layer on the gate insulating layer.

In such an embodiment, since the gate electrode, the source electrode and the drain electrode are formed as or defined by the same layer, the number of mask processes used to fabricate the thin-film transistor can be reduced.

In addition, according to an embodiment, the active layer includes or is made of an oxide semiconductor in a crystalline phase by heat treatment. An oxide semiconductor in a crystalline phase has a lower etch rate for an etching material containing fluorine (F) than an oxide semiconductor in an amorphous phase.

According to an embodiment of the disclosure, a method of fabricating a transistor array substrate includes forming a second semiconductor material layer in a crystalline phase by performing heat treatment on a first semiconductor material layer including or made of an oxide semiconductor in an amorphous phase; disposing an electrode conductive layer; and forming an active layer by making a part of the second semiconductor material layer conductive.

Accordingly, even when a part of the second semiconductor material layer is exposed to the etching material containing fluorine (F) used in the process of disposing an electrode conductive layer, the part of the second semiconductor material layer is not removed but remain as it is.

Therefore, according to an embodiment of the disclosure, the thin-film transistor and the transistor array substrate including the thin-film transistor can be fabricated with a relatively small number of mask processes without compromising the reliability and the uniformity of current characteristics.

In addition, according to the method of fabricating a transistor array substrate according to an embodiment, a transistor array substrate including thin-film transistor exhibiting relatively high reliability and relatively high uniformity of current characteristics can be prepared by a relatively small number of mask processes.

However, the features of embodiments of the disclosure are not limited to the aforementioned effects, and various other effects are included in the specification.

BRIEF DESCRIPTION OF THE DRAWINGS

The above and other features of embodiments of the disclosure will become more apparent by describing in detail embodiments thereof with reference to the accompanying drawings, in which:

FIG. 3 is a schematic cross-sectional view taken along line A-A' of FIG. 1.

FIG. 8 is a flowchart for illustrating a method for fabricating a transistor array substrate according to an embodiment of the disclosure.

DETAILED DESCRIPTION

Figure 1:
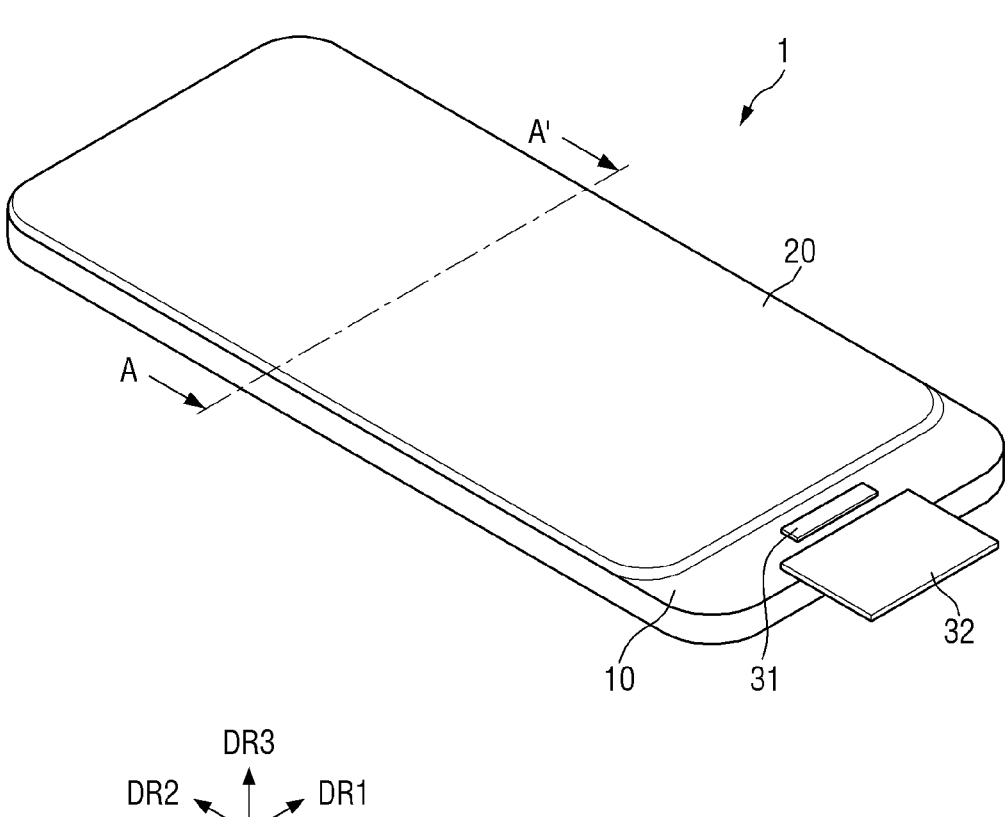
FIG. 1 is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings.

Figure 2:
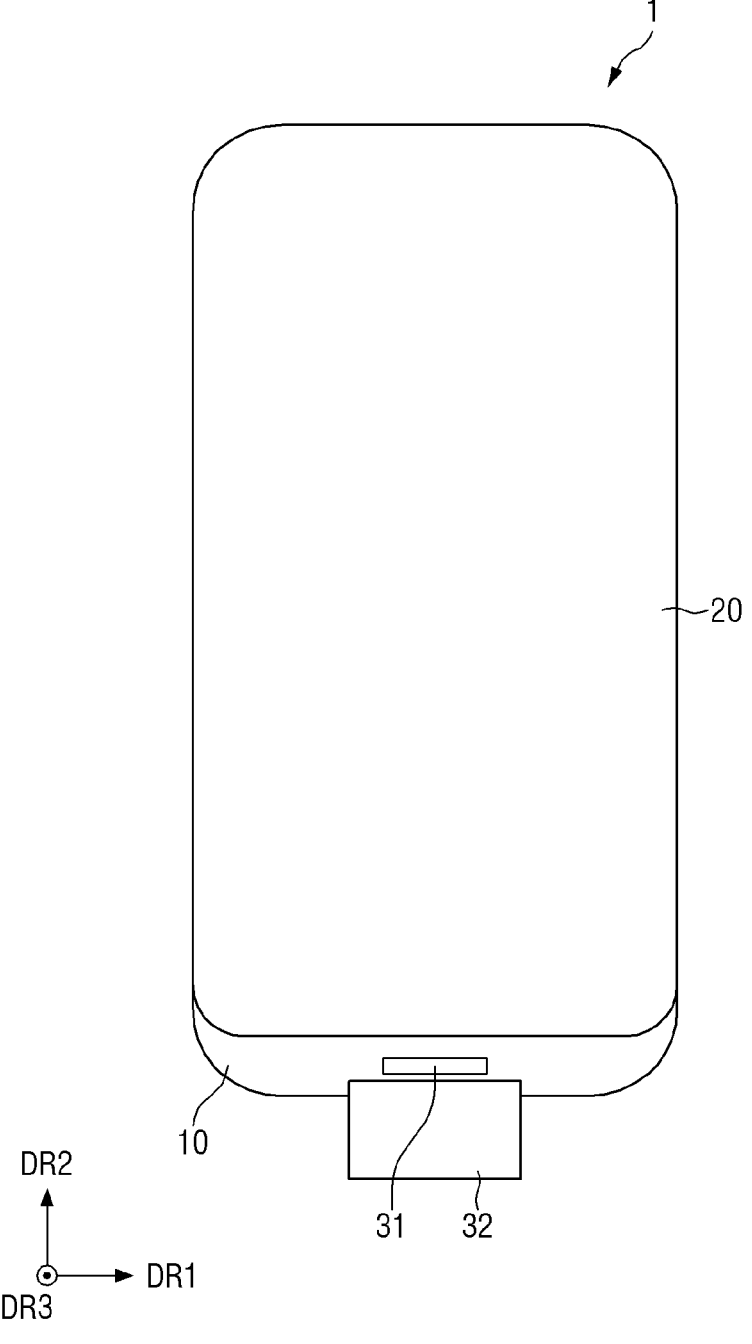
FIG. 2 is a plan view showing the display device of FIG. 1.

FIG. 1 is a perspective view of a display device according to an embodiment of the disclosure. FIG. 2 is a plan view showing the display device of FIG. 1. FIG. 3 is a schematic cross-sectional view taken along line A-A' of FIG. 1.

Referring to FIGS. 1 to 2, an embodiment of a display device 1 is for displaying moving images or still images. The display device 1 may be used as the display screen of portable electronic devices such as a mobile phone, a smart phone, a tablet personal computer (PC), a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things (IoT).

The display device 1 may be a light-emitting display device such as an organic light-emitting display device using organic light-emitting diodes, an inorganic light-emitting display device including an inorganic semiconductor, or a micro light-emitting display device using micro or nano light-emitting diodes (LEDs). Hereinafter, for convenience of description, embodiments where the display device 1 is an organic light-emitting display device will be described in detail. It should be understood, however, that the disclosure is not limited thereto. Alternatively, a display device including an organic insulating material, an organic light-emitting material and a metal material may be employed as the display device 1.

The display device 1 may be formed flat, but is not limited thereto. In an alternative embodiment, for example, the display device 1 may include curved portions that are formed at left and right ends and have a constant curvature or varying curvatures. In addition, the display device 1 may be flexible so that the display device 1 can be curved, bent, folded or rolled.

The display device 1 may include a transistor array substrate 10.

The display device 1 may further include a cover substrate 20 facing the transistor array substrate 10 and covering a light-emitting element layer 13.

In addition, the display device 1 may further include a display driving circuit 31 for supplying data signals to data lines DL (see FIG. 4) of the circuit layer 12 (see FIG. 3) of the transistor array substrate 10, and a circuit board 32 for supplying a variety of signals and voltages to the transistor array substrate 10 and the display driving circuit 31.

Referring to FIG. 3, in an embodiment, the transistor array substrate 10 may include a substrate 11 and a circuit layer 12 disposed on the substrate 11.

The transistor array substrate 10 may further include the light-emitting element layer 13 disposed on the circuit layer 12.

In such an embodiment, the light-emitting element layer 13 is disposed between the substrate 11 and the cover substrate 20.

The circuit layer 12 supplies driving signals for the sub-pixels which are associated with the image signals to the light-emitting element layer 13. The light-emitting element layer 13 may emit light from each of the sub-pixels according to the driving signal. Light from the light-emitting element layer 13 may exit to the outside through at least one of the substrate 11 and the cover substrate 20, such that the display device 1 can display images.

In addition, the display device 1 may further include a touch sensing unit (not shown) that senses coordinates of a point touched by a user on a display surface that outputs lights for displaying images.

The touch sensing unit may be attached to one surface of the cover substrate 20 or may be disposed between the transistor array substrate 10 and the cover substrate 20.

The touch sensing unit may include touch electrodes (not shown) arranged in a touch sensing area corresponding to the display surface and made of a transparent conductive material.

Such a touch sensing unit may periodically sense a change in capacitance value of the touch electrodes while touch driving signals are applied to the touch electrodes, to detect whether a touch is input and the coordinates of the point of the touch, if any.

The cover substrate 20 may face the transistor array substrate 10 and may be attached to the transistor array substrate 10.

The cover substrate 20 may be an element for providing rigidity to protect against external physical and electrical shocks. The cover substrate 20 may include or be made of a transparent material having insulating properties and rigidity.

In an embodiment, the display device 1 may further include a sealing layer 30 disposed at the edge between the transistor array substrate 10 and the cover substrate 20 and attaching the transistor array substrate 10 and the cover substrate 20 together or to each other.

In addition, the display device 1 may further include a filling layer (not shown) disposed to fill between the transistor array substrate 10 and the cover substrate 20.

In an embodiment, as shown in FIGS. 1 and 2, the display surface of the display device 1 may have a rectangular shape with shorter sides in a first direction (x-axis direction) and longer sides in a second direction (y-axis direction) intersecting the first direction (x-axis direction). It should be understood, however, that this is merely illustrative. The display surface of the display device 1 may be implemented in a variety of forms.

In an embodiment, for example, each of the corners where the shorter side in the first direction (x-axis direction) meets the longer side in the second direction (y-axis direction) may be rounded with a predetermined curvature. Alternatively, the display surface may be in the form of a polygon, a circle, an ellipse, etc.

In an embodiment, as shown in FIG. 1, the transistor array substrate 10 is in the form of a flat plate, but the disclosure is not limited thereto. Alternatively, the transistor array substrate 10 may have a shape in which the opposing ends in the y-axis direction are bent. Alternatively, the transistor array substrate 10 may be flexible so that the transistor array substrate 10 can be curved, bent, folded or rolled.

The display driving circuit 31 outputs signals and voltages for driving the transistor array substrate 10.

In an embodiment, for example, the display driving circuit 31 may supply data signals to data lines DL (see FIG. 4) of the transistor array substrate 10 and may supply first supply voltages to first supply voltage lines VDL (see FIG. 4) of the transistor array substrate 10. In addition, the display driving circuit 31 may supply a scan control signal to a gate driver 33 (see FIG. 4) incorporated into the transistor array substrate 10.

The display driving circuit 31 may be implemented as an integrated circuit (IC).

The IC chip of the display driving circuit 31 may be mounted directly on the transistor array substrate 10 by a chip on glass (COG) technique, a chip on plastic (COP) technique, or an ultrasonic bonding. As shown in FIG. 2, the IC chip of the display driving circuit 31 may be disposed on a part of the transistor array substrate 10 that is not covered by the cover substrate 20.

Alternatively, the IC chip of the display driving circuit 31 may be mounted on the circuit board 32.

The circuit board 32 may include an anisotropic conductive film. The circuit board 32 may be a flexible printed circuit board, a printed circuit board, or a flexible film such as a chip-on-film.

The circuit board 32 may be attached to electrode pads of the transistor array substrate 10. Accordingly, lead lines of the circuit board 32 may be electrically connected to the electrode pads of the transistor array substrate 10.

Figure 4:
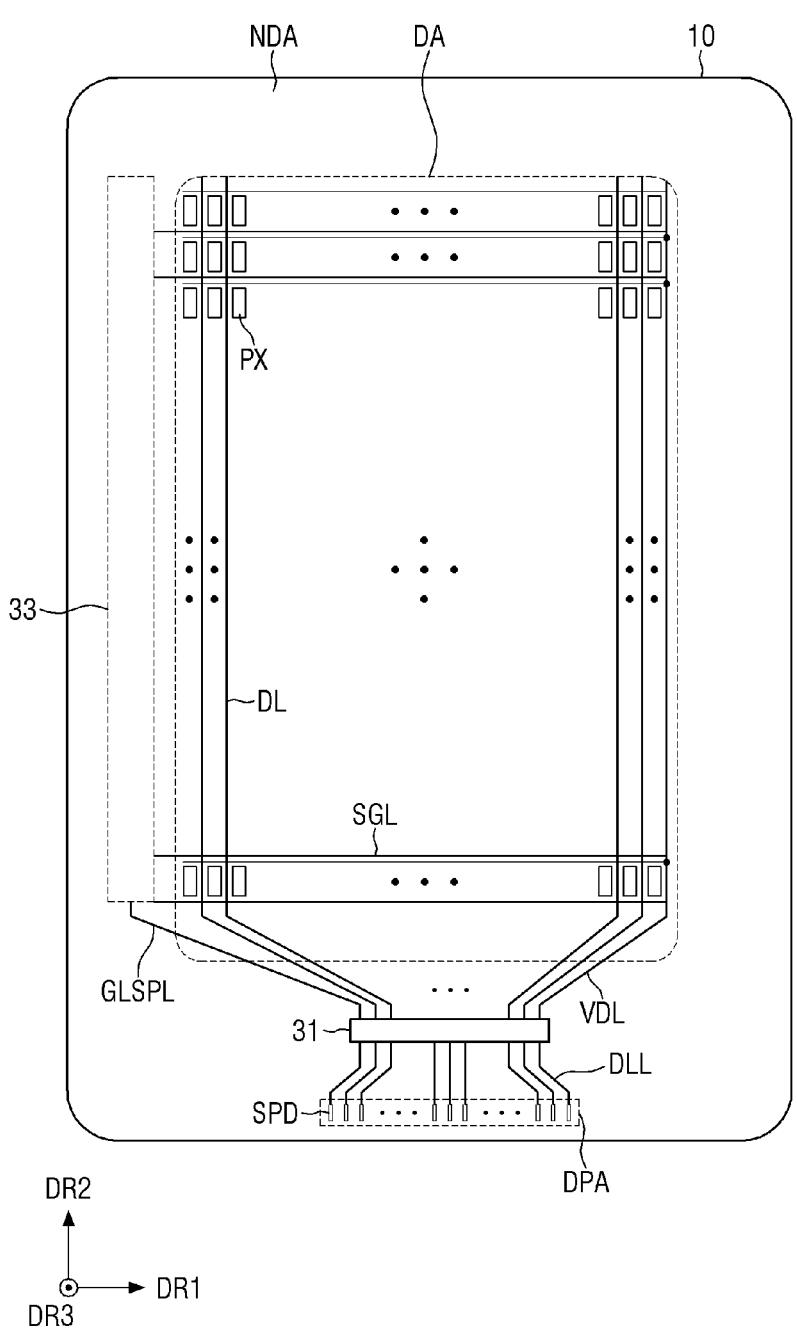
FIG. 4 is a view showing an embodiment of the circuit layer of FIG. 3.

FIG. 4 is a view showing an embodiment of the circuit layer of FIG. 3.

Referring to FIG. 4, the transistor array substrate 10 may include a display area DA where lights are output for displaying images, and a non-display area NDA around the display area DA. The non-display area NDA may be defined between the border of the display area DA to the border of the substrate 11 (see FIG. 3).

The transistor array substrate 10 includes sub-pixels PX that are arranged in a matrix pattern in the vertical and horizontal directions in the display area DA. Each of the sub-pixels PX may be a unit that individually displays a luminance and a color.

The non-display area NDA may include a display pad area DPA disposed adjacent to the edge of the substrate 11. The transistor array substrate 10 may further include signal pads SPD disposed in the display pad area DPA of the non-display area NDA.

The circuit board 32 may be attached to the display pad area DPA of the transistor array substrate 10 and electrically connected to the signal pads SPD.

The transistor array substrate 10 further includes lines disposed in the display area DA and supplying signals or power to the plurality of sub-pixels PX. The lines of the transistor array substrate 10 may include scan gate lines SL, data lines DL, and first supply voltage lines VDL.

The scan gate lines SL may extend in a first direction DR1 (the horizontal disposed of FIG. 4).

The data lines DL may extend in a second direction DR2 (the vertical direction of FIG. 4).

The first supply voltage line VDL may extend in one of the first and second directions DR1 and DR2. In an embodiment, for example, the first supply voltage line VDL may extend in the second direction DR2 like the data lines DL. Here, the first and second direction DR1 and DR2 may be directions on a plane perpendicular to a third DR3 or a thickness direction of the transistor array substrate 10.

Alternatively, the circuit layer 12 may further include a first auxiliary voltage line (not shown) extending in a direction crossing the first supply voltage line VDL and electrically connected to the first supply voltage line VDL to reduce a RC delay of the first supply voltage due to the resistance of the first supply voltage line VDL.

The scan gate lines SL transfer scan signals for controlling whether or not to transmit the data signals to the sub-pixels PX.

The scan gate lines SL may be connected to a gate driver 33 disposed in a part of the non-display area NDA of the transistor array substrate 10.

The gate driver 33 may be electrically connected to the display driving circuit 31 or at least one signal pad SPD among the signal pads SPD through at least one gate control supply line GCSPL.

The gate driver 33 may apply scan signals to the scan gate lines SGL based on a gate control signal and gate level power supplied through at least one gate control supply line GCSPL.

In an embodiment, as shown in FIG. 4, the gate driver 33 is disposed in a part of the non-display area NDA that is adjacent to one side (e.g., the left side part of FIG. 4) of the display area DA in the first direction DR1. It should be understood, however, that this is merely illustrative. The gate driver 33 may be disposed in another part of the non-display area NDA (e.g., the right side part of FIG. 4). Alternatively, the gate driver 33 may be disposed adjacent to opposing sides of the display area DA in the horizontal direction.

The data lines DL are electrically connected between the display driving circuit 31 and the sub-pixels PX, and transfer the data signals output from the display driving circuit 31 to the sub-pixels PX.

The display driving circuit 31 may be electrically connected to some of the signal pads SPD through data connection lines DLL. That is to say, the display driving circuit 31 may be electrically connected to the circuit board 32 through the data connection lines DLL and some signal pads SPD.

The circuit board 32 may supply digital video data and timing signals associated with video signals to the display driving circuit 31.

Figure 5:
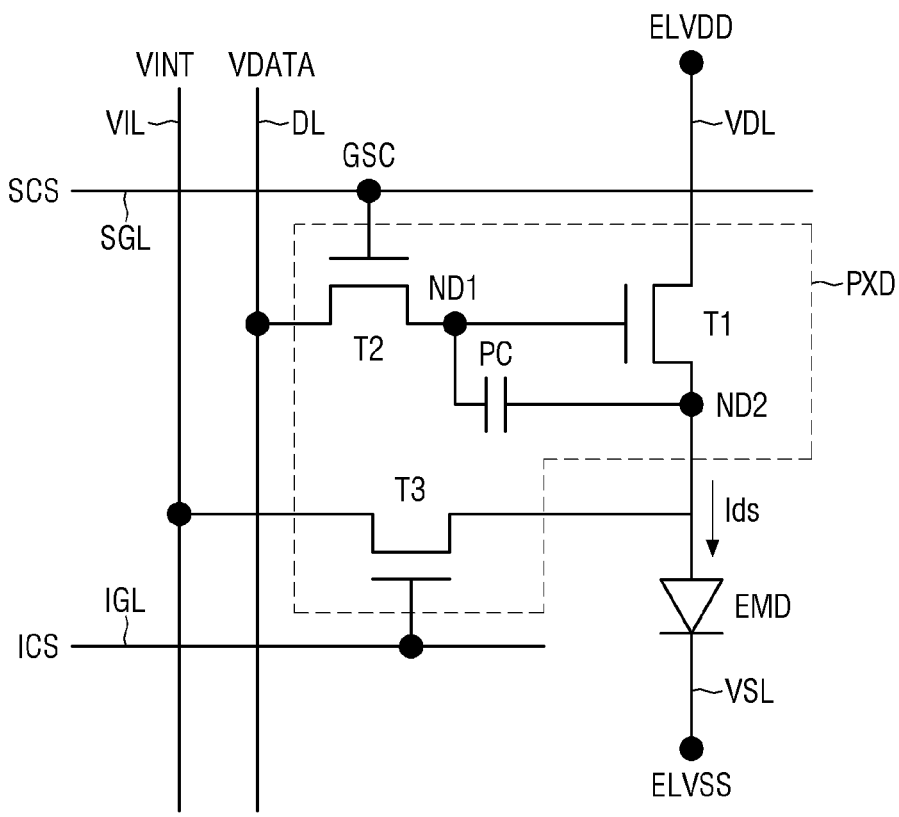
FIG. 5 is an equivalent circuit diagram showing an embodiment of one sub-pixel of FIG. 4.

The circuit layer 12 may further include the first supply voltage line VDL and a second supply voltage line (not shown) extending from the non-display area NDA to the display area DA and transfer a first supply voltage ELVDD (see FIG. 5) and a second supply voltage ELVSS (see FIG. 5), respectively, for driving light-emitting elements EMD (see FIG. 5). The second supply voltage ELVSS may have a lower voltage level than the first supply voltage ELVDD.

Each of the first supply voltage line VDL and the second supply voltage line (not shown) may be electrically connected to the display driving circuit 31 or at least one signal pad SPD among the signal pads SPD.

The circuit layer 12 includes pixel drivers PXD (see FIG. 5) associated with the sub-pixels PX and electrically connected to the scan gate lines SGL, the data lines DL, and the first supply voltage lines VDL.

FIG. 5 is an equivalent circuit diagram showing an embodiment of one sub-pixel of FIG. 4.

Referring to FIG. 5, one of the pixel drivers PXD associated with the sub-pixels PX, respectively, includes one or more thin-film transistors T1, T2 and T3.

In an embodiment, for example, one pixel driver PXD may include a first thin-film transistor T1, a second thin-film transistor T2, and a third thin-film transistor T3. In addition, one pixel driver PXD may further include a pixel capacitor PC.

One pixel driver PXD is electrically connected to one of the light-emitting elements EMD of the light-emitting element layer 13. In an embodiment, one pixel driver PXD is electrically connected to an anode electrode AND (see FIGS. 6 and 7) of one light-emitting element EMD and supplies a driving current to the light-emitting element EMD.

One light-emitting element EMD may be an organic light-emitting diode including an emissive layer including or made of an organic material. Alternatively, one light-emitting element EMD may include an emissive layer including or made of an inorganic material. Alternatively, the light-emitting element EMD may be a quantum-dot light-emitting element having a quantum-dot emissive layer. Alternatively, the light-emitting element EMD may be a micro LED.

The first thin-film transistor T1 is connected in series with the light-emitting element EMD between the first supply voltage line VDL and the second supply voltage line VSL. In an embodiment, a first electrode (e.g., the source electrode) of the first thin-film transistor T1 may be electrically connected to the first supply voltage line VDL, and a second electrode (e.g., the drain electrode) of the first thin-film transistor T1 may be electrically connected to the anode electrode AND of the light-emitting element EMD.

It should be understood that the source electrode and the drain electrode of the first thin-film transistor T1 may be changed differently from the embodiment shown in FIG. 5 depending on the structure type of the first thin-film transistor T1.

A cathode electrode CTD (see FIG. 7) of the light-emitting element EMD may be electrically connected to the second supply voltage line VSL.

In addition, a gate electrode of the first thin-film transistor T1 may be electrically connected to the second thin-film transistor T2.

The pixel capacitor PC may be electrically connected to a first node ND1 and a second node ND2. The first node ND1 is a contact point between the gate electrode of the first thin-film transistor T1 and the second thin-film transistor T2. The second node ND2 is a contact point between the first thin-film transistor T1 and the light-emitting element EMD.

The second thin-film transistor T2 may be electrically connected between the data line DL and the gate electrode of the first thin-film transistor T1 and may be turned on in response to the scan signal SCS of the scan gate line SGL.

In such an embodiment, when the scan signal SCS is applied through the scan gate line SGL, the second thin-film transistor T2 is turned on, and the data line DL and the gate electrode of the first thin-film transistor T1 are electrically connected with each other, such that a data signal VDATA of the data line DL is transmitted to the pixel capacitor PC and the gate electrode of the first thin-film transistor T1 through the turned-on second thin-film transistor T2 and the first node ND1.

The first thin-film transistor T1 may be turned on when a voltage difference between the gate electrode and the source electrode becomes greater than a threshold voltage. That is to say, when the data signal VDATA is applied through the first node ND1, the voltage difference between the gate electrode and the source electrode of the first thin-film transistor T1 becomes greater than the threshold voltage by the first supply voltage ELVDD and the data signal VDATA, so that the first thin-film transistor T1 may be turned on, and accordingly, the current Ids between the source electrode and the drain electrode of the first thin-film transistor T1 is supplied as the driving current of the light-emitting element EMD. In addition, the magnitude of the current Ids between the source and drain electrodes of the first thin-film transistor T1 is in proportional to the data signal VDATA. Specifically, the driving current Ids in proportional to the data signal VDATA is supplied to the light-emitting element EMD, the light-emitting element EMD may emit light having a luminance corresponding to the data signal VDATA.

The pixel capacitor PC is electrically connected between the first node ND1 and the second node ND2. Therefore, a potential difference between the gate electrode and the drain electrode of the first thin-film transistor T1 may be held or maintained by the pixel capacitor PC until the potential of the first node ND1 is changed by the data signal VDATA.

The third thin-film transistor T3 may be electrically connected between an initialization voltage line VIL and the second node ND2. A gate electrode of the third thin-film transistor T3 may be electrically connected to an initialization gate line IGL.

In an embodiment, when an initialization control signal ICS is applied through the initialization gate line IGL, the third thin-film transistor T3 is turned on, and the initialization voltage line VIL and the second node ND2 are electrically connected with each other, such that the initialization voltage VINT of the initialization voltage line VIL may be supplied to the anode electrode AND of the light-emitting element EMD through the turned-on third thin-film transistor T3 and the second node ND2. Accordingly, the potential of the anode electrode AND may be initialized to the initialization voltage VINT.

Although the pixel driver PXD has a three-transistor-one-capacitor (3T1C) structure including the first thin-film transistor T1, the second thin-film transistor T2, the third thin-film transistor T3 and the single pixel capacitor PC in the example shown in FIG. 5, it is to be understood that the disclosure is not limited thereto. That is to say, the pixel driver PXD according to the embodiment is not limited to the 3T1C structure shown in FIG. 5 but may be altered differently from that shown in FIG. 5 as desired. In an alternative embodiment, for example, the pixel driver PXD may further include a thin-film transistor for initializing the potential of the first node ND1.

Although each of the thin-film transistors T1, T2 and T3 is implemented as a metal oxide semiconductor field effect transistor (MOSFET) in the embodiment shown in FIG. 5, this is merely illustrative. In an embodiment, for example, at least one selected from the thin-film transistors T1, T2 and T3 in the pixel driver PXD may be a p-type MOSFET.

Figure 6:
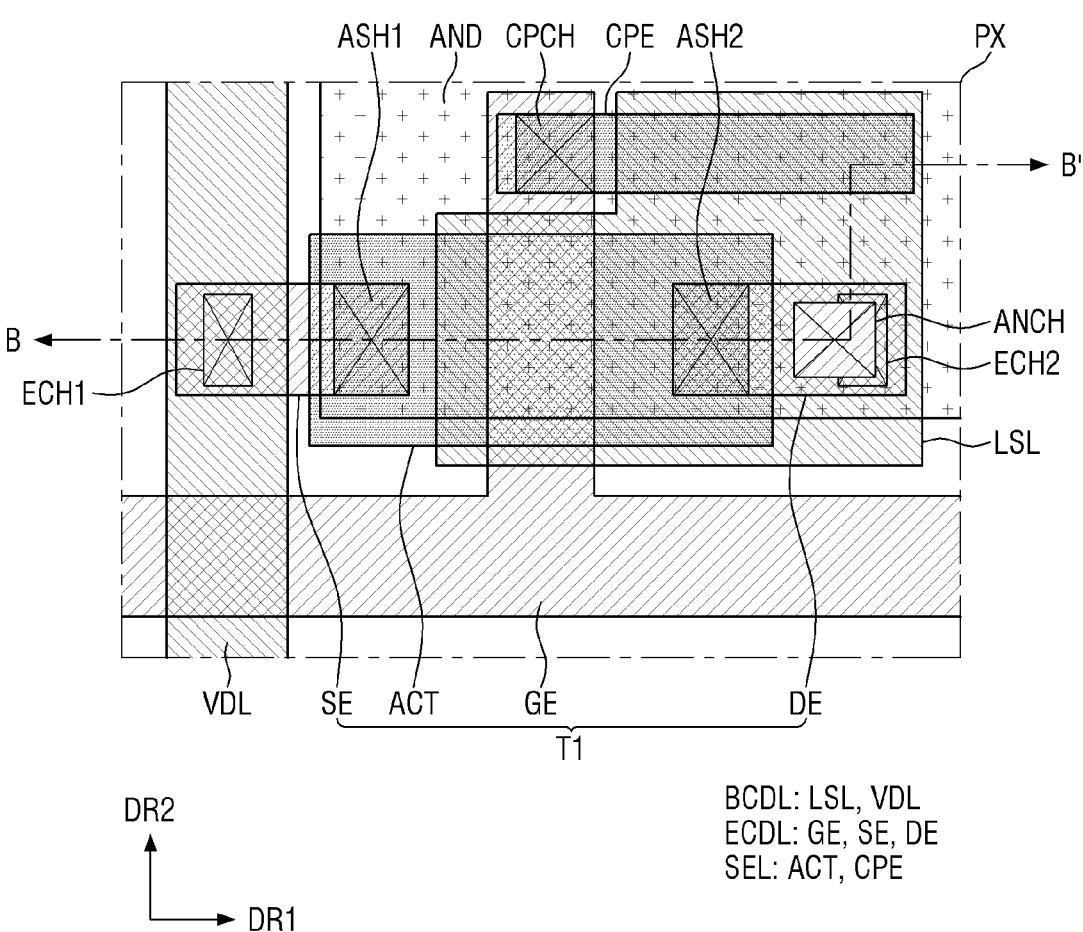
FIG. 6 is a plan view showing an embodiment of the first thin-film transistor and the pixel capacitor of the pixel driver of FIG. 5.
Figure 7:
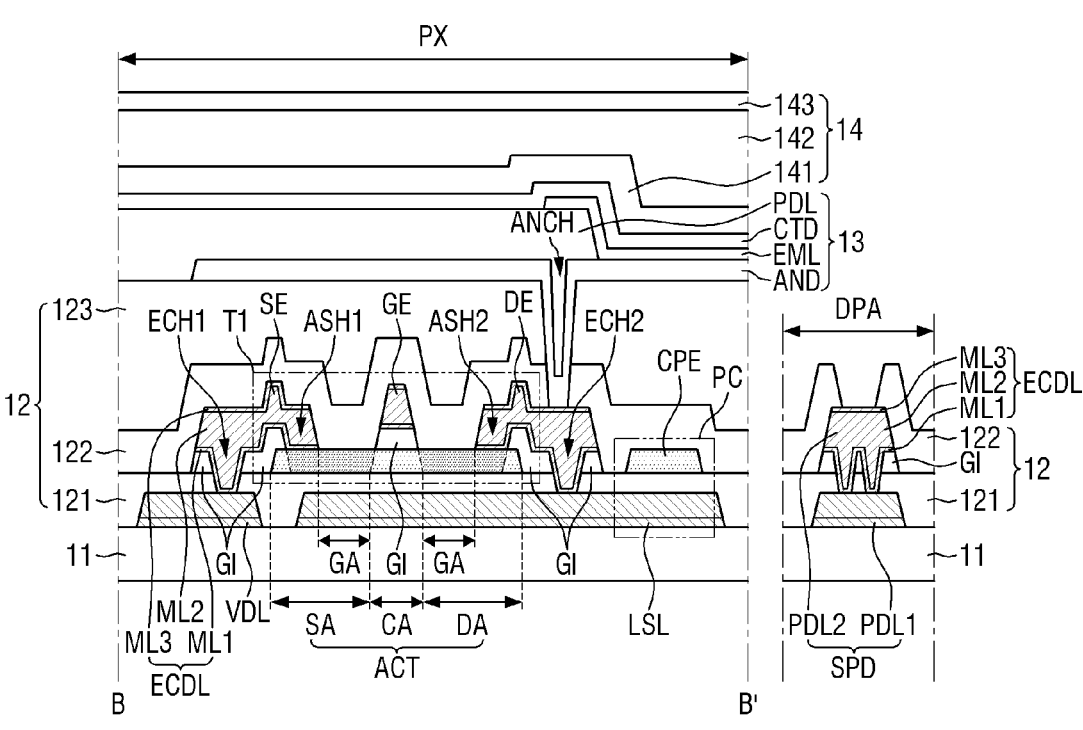
FIG. 7 is a cross-sectional view taken along line B-B' of FIG. 6.

FIG. 6 is a plan view showing an embodiment of the first thin-film transistor and the pixel capacitor of the pixel driver of FIG. 5. FIG. 7 is a cross-sectional view taken along line B-B' of FIG. 6.

Referring to FIG. 6, the first thin-film transistor T1 according to an embodiment includes an active layer ACT, a gate electrode GE, a source electrode SE, and a drain electrode DE.

Although not shown in detail, structures of the second thin-film transistor T2 and the third thin-film transistor T3 of the pixel driver PXD are substantially the same as those of the first thin-film transistor T1 shown in FIGS. 6 and 7; and, therefore, any repetitive detailed descriptions thereof will be omitted. In the following description, the first thin-film transistor T1 of FIGS. 6 and 7 may be simply referred to as a thin-film transistor T1.

Referring to FIG. 7, the active layer ACT is disposed on the substrate 11. The active layer ACT includes a channel region CA at the central portion, a source region SA connected to one side of the channel region CA, and a drain region DA connected to the opposite side of the channel region CA.

According to an embodiment, the active layer ACT includes or is made of an oxide semiconductor SEL containing crystals by heat treatment.

In such an embodiment, the active layer ACT is not made of an oxide semiconductor in an amorphous phase but is made of an oxide semiconductor in a crystalline phase via a heat treatment process. The heat treatment process may be carried out at a temperature between about 350 degrees Celsius and about 450 degrees Celsius.

In such an embodiment where the active layer ACT includes or is made of an oxide semiconductor in a crystalline phase as described above, chemical resistance to an etching material containing fluorine (F) is increased compared to the active layer ACT in an amorphous phase. As a result, it is not easily removed even if the active layer ACT is exposed to the etching material. That is to say, even without an etch-stop layer, a mask, etc. for protecting the active layer ACT to reduce the number of mask processes, the active layer ACT can be disposed in an intact shape in a plan view, that is, the active layer ACT includes an intact shape without undesired holes formed therein even when a part of the active layer ACT is exposed to an etching material.

Accordingly, in such an embodiment, the current paths in the active layer ACT are not reduced by the holes HOLE, so that the reliability and the uniformity of current characteristics of the thin-film transistor T1 can be improved.

At least a part of the active layer ACT excluding the channel region CA may be in a conductive state to have higher conductivity than the channel region CA. In other words, at least a part of the source region SA and at least a part of the drain region DA may be in a conductive state. In particular, gap areas GA between each of the source electrode SE and the drain electrode DE of the active layer ACT and the gate electrode GE, that is, the gap areas GA between the source electrode SE and the gate electrode GE and between the drain electrode DE and the gate electrode GE, may be in a conductive state.

The conductive state may refer to a state in which conductivity is increased by reducing the oxygen content or increasing the hydrogen content compared to the channel region CA.

A part of the active layer ACT covered by the gate insulating layer GI includes the channel region CA and may maintain semiconductor properties without becoming conductive. On the other hand, a part of the active layer ACT that is not covered by the gate insulating layer GI may be in contact with the etching material when the gate insulating layer GI is removed, and may react with the etching material to become conductive.

In this manner, when at least a part of the source region SA and at least a part of the drain region DA become conductive, the resistance of the thin-film transistor T1 is lowered, and thus the magnitude of the source-drain current of the thin-film transistor T1 may increase, such that current characteristics of the thin-film transistor T1 can be improved.

According to an embodiment, the gate electrode GE, the source electrode SE and the drain electrode DE all may be included in or defined by an electrode conductive layer ECDL on the gate insulating layer GI covering a part of the active layer ACT. In such an embodiment, the number of mask processes used for disposing the thin-film transistor T1 can be reduced.

In an embodiment, as shown in FIGS. 6 and 7, the gate electrode GE is formed of or defined by the electrode conductive layer ECDL on the gate insulating layer GI and overlaps the channel region CA of the active layer ACT.

The source electrode SE may be formed of or defined by the electrode conductive layer ECDL on the gate insulating layer GI, may extend to the source region SA of the active layer ACT, and may be in contact with a part of the source region SA. Accordingly, the source electrode SE may be electrically connected to the source region SA of the active layer ACT. In an embodiment, the source electrode SE may be in contact with or be adjacent to a conductive part of the source region SA to lower the resistance between the source electrode SE and the active layer ACT.

The drain electrode DE may be formed of or defined by the electrode conductive layer ECDL on the gate insulating layer GI, may extend to the drain region DA of the active layer ACT, and may be in contact with a part of the drain region DA. Accordingly, the drain electrode DE may be electrically connected to the drain region DA of the active layer ACT. In an embodiment, the drain electrode DE may be in contact with or be adjacent to a conductive part of the drain region DA to lower the resistance between the drain electrode DE and the active layer ACT.

As described above, according to an embodiment, the gate electrode GE, the source electrode SE and the drain electrode DE of the thin-film transistor T1 are all formed of or defined by the electrode conductive layer ECDL on the gate insulating layer GI, and accordingly the number of mask processes used for disposing the thin-film transistor T1 can be reduced.

In addition, according to an embodiment, the active layer ACT of the thin-film transistor T1 includes or is made of an oxide semiconductor SEL crystallized by heat treatment. The oxide semiconductor SEL crystallized by heat treatment may have increased chemical resistance to an etching material containing fluorine (F), compared to an oxide semiconductor in an amorphous phase. Accordingly, in such an embodiment, even when a part of the active layer ACT is exposed to the etching material for disposing the electrode conductive layer ECDL by reducing the number of mask processes, the part of the active layer ACT may not be easily lost and can remain as it is.

As a result, as shown in FIGS. 6 and 7, the active layer ACT can be disposed in an intact shape in a plan view, that is, the active layer ACT includes an intact shape without holes defined or formed therein.

In such an embodiment, the gap areas of the active layer ACT, which do not overlap the gate electrode GE, the source electrode SE and the drain electrode DE, may also be disposed in an intact shape in a plan view, that is, an intact shape without holes, as well as the regions of the active layer ACT which overlap the gate electrode GE, the source electrode SE and the drain electrode DE.

That is to say, the gap areas GA of the active layer ACT between each of the source electrode SE and the drain electrode DE and the gate electrode GE may be flush with the channel region CA or integrally formed with the channel region CA as a single unitary and indivisible part.

The circuit layer 12 of the transistor array substrate 10 according to an embodiment may further include a buffer layer 121 disposed between the substrate 11 and the active layer ACT, and an interlayer dielectric layer 122 covering the gate electrode GE, the source electrode SE and the drain electrode DE of the thin-film transistor T1.

In addition, the circuit layer 12 of the transistor array substrate 10 according to an embodiment may further include a planarization layer 123 that is evenly disposed on the interlayer dielectric layer 122.

In such an embodiment, the active layer ACT may be disposed on the buffer layer 121 covering the substrate 11. In addition, the gate electrode GE, the source electrode SE and the drain electrode DE of the thin-film transistor T1 may be covered with the interlayer dielectric layer 122.

As described above, according to an embodiment, the active layer ACT include or is made of a crystallized oxide semiconductor SEL and thus is disposed in an intact shape in a plan view, that is, the active layer ACT includes an intact shape without holes. Accordingly, the gap areas GA of the active layer ACT between each of the source electrode SE and the drain electrode DE and the gate electrode GE may be in contact with the interlayer dielectric layer 122 and may be disposed between the interlayer dielectric layer 122 and the buffer layer 121 to separate the interlayer dielectric layer 122 from the buffer layer 121. In such an embodiment, the buffer layer 121 and the interlayer dielectric layer 122 are not in direct contact with each other by the active layer ACT.

Accordingly, it is possible to avoid the current paths in the active layer ACT from being changed by holes therein, and thus the reliability and the uniformity of current characteristics of the thin-film transistor T1 can be improved.

As shown in FIGS. 6 and 7, the circuit layer 12 of the transistor array substrate 10 according to an embodiment may further include a light-blocking electrode LSL formed of or defined by the light-blocking conductive layer BCDL on the substrate 11 and overlapping at least the channel region CA of the active layer ACT. In such an embodiment, the light-blocking electrode LSL may effectively prevent leakage current of the active layer ACT due to external light incident through the substrate 11.

The circuit layer 12 of the transistor array substrate 10 according to an embodiment may further include a scan gate line SGL (shown in FIGS. 4 and 5) that transmits a scan signal SCS to the pixel drivers PXD, a data line DL that transfers a data signal VDATA to the pixel drivers PXD, and an initialization voltage line VIL (shown in FIG. 5) that transfers an initialization voltage VINT to the pixel drivers PXD.

In addition, the circuit layer 12 of the transistor array substrate 10 may further include the first supply voltage lines VDL for transmitting the first supply voltage ELVDD to the pixel drivers PXD.

In addition, the circuit layer 12 of the transistor array substrate 10 may further include an initialization gate line IGL (shown in FIG. 5) for transmitting an initialization control signal ICS to the pixel drivers PXD.

The scan gate line SGL and the initialization gate line IGL may extend in the first direction DR1 and may be spaced apart from each other in the second direction DR2.

The data line DL, the first supply voltage line VDL and the initialization voltage line VIL may extend in the second direction DR2 and spaced apart from one another in the first direction DR1.

The lines in the first direction DR1 including the scan gate line SGL and the initialization gate line IGL may be formed as or defined by a different conductive layer from the lines in the second direction DR2 including (or defining) the data line DL, the first supply voltage line VDL and the initialization voltage line VIL, and may be insulated from each other by the buffer layer 121.

In an embodiment, for example, the lines in the second direction DR2 including the data line DL, the first supply voltage line VDL and the initialization voltage line VIL may be formed of or defined by the light-blocking conductive layer BCDL, and the lines in the first direction DR1 including the scan gate line SGL and the initialization gate line IGL may be formed of or defined by the electrode conductive layer ECDL.

The circuit layer 12 of the transistor array substrate 10 according to an embodiment may further include signal pads SPD disposed in the display pad area DPA.

As shown in FIG. 7, one of the signal pads SPD may include a first pad layer PDL1 formed as a same layer (or disposed in or directly on a same) as the light-blocking conductive layer BCDL on the substrate 11, and a second pad layer PDL2 formed as the same layer as the electrode conductive layer ECDL on the gate insulating layer GI and electrically connected to the first pad layer PDL1.

The second pad layer PDL2 may be electrically connected to the first pad layer PDL1 through at least one hole defined through the buffer layer 121.

The interlayer dielectric layer 122 may cover the edge (and side surfaces) of the second pad layer PDL2.

In an embodiment, a central portion of a top surface of the second pad layer PDL2 may be exposed without being covered with the interlayer dielectric layer 122 for bonding with the circuit board 32. In addition, the side surfaces and the edge portions of the top surface of the second pad layer PDL2 may be covered with the interlayer dielectric layer 122 to be protected from corrosion or physical impact. In addition, a top layer (or an uppermost layer) of the electrode conductive layer ECDL may include or be made of indium tin oxide (ITO) to prevent corrosion of the second pad layer PDL2.

The substrate 11 may include or be made of an insulating material such as a polymer resin. In an embodiment, for example, the substrate 11 may include or be made of polyimide. The substrate 11 may be a flexible substrate that can be bent, folded, or rolled.

Alternatively, the substrate 11 may include or be made of a rigid insulating material such as glass.

Each of the buffer layer 121, the gate insulating layer GI and the interlayer dielectric layer 122 may be formed as or defined by at least one inorganic film. In an embodiment, for example, each of the buffer layer 121, the gate insulating layer GI and the interlayer dielectric layer 122 may include or be made up of multiple films in which one or more inorganic films of silicon nitride, silicon oxynitride, silicon oxide, titanium oxide and aluminum oxide are alternately stacked on one another.

The light-blocking conductive layer BCDL on the substrate 11 may be made up of or defined by a single layer or multiple layers, each layer including molybdenum (Mo), aluminum (Al), chromium (Cr), gold (Au), titanium (T1), nickel (Ni), neodymium (Nd) and copper (Cu) or an alloy thereof.

As shown in FIG. 6, the light-blocking conductive layer BCDL may include the first supply voltage line VDL and a light-blocking electrode LSL.

The light-blocking conductive layer BCDL may further include a data line DL and an initialization voltage line VIL extending in the second direction DR2.

In an embodiment, the light-blocking conductive layer BCDL may further include the first pad layer PDL1 of the signal pad SPD.

One of the source electrode SE and the drain electrode DE of the first thin-film transistor T1 (e.g., the source electrode SE shown in FIG. 6) may be electrically connected to the first supply voltage line VDL through a first electrode connection hole ECH1 defined through the gate insulating layer GI and the buffer layer 121.

The other of the source electrode SE and the drain electrode DE of the first thin-film transistor T1 (e.g., the drain electrode DE shown in FIG. 6) may be electrically connected to the light-blocking electrode LSL through a second electrode connection hole ECH2 defined through the gate insulating layer GI and the buffer layer 121.

In such an embodiment, the light-blocking electrode LSL may not be floating state but may be electrically connected to the drain electrode DE of the first thin-film transistor T1. Thus, the potential of the second node ND2 between the first thin-film transistor T1 and the light-emitting element EMD can be stably maintained.

The light-emitting element layer 13 includes light-emitting elements EMD associated with the sub-pixels PX, respectively. One of the light-emitting elements EMD may include an anode electrode AND and a cathode electrode CTD which face each other, and an emissive layer EML disposed between the anode electrode AND and the cathode electrode CTD and includes or is made of a photoelectric conversion material.

The anode electrode AND may be disposed on the planarization layer 123, and may be electrically connected to the drain electrode DE of the first thin-film transistor T1 through an anode contact hole ANCH defined through the planarization layer 123 and the interlayer dielectric layer 122.

In an embodiment, the light-emitting element layer 13 may further include a pixel-defining layer PDL covering an edge of the anode electrode AND.

The circuit layer 12 of the transistor array substrate 10 according to the embodiment may further include a capacitor electrode CPE for forming a pixel capacitor PC.

The capacitor electrode CPE is formed as or defined by a same layer (disposed in or directly on a same layer) as the active layer ACT. In an embodiment, the capacitor electrode CPE may include or be made of an oxide semiconductor crystallized by heat treatment and in a conductive state.

The capacitor electrode CPE may be electrically connected to the gate electrode GE of the first thin-film transistor T1 through a capacitor connection hole CPCH defined the gate insulating layer GI. In such an embodiment, the gate electrode GE of the first thin-film transistor T1 may extend to the capacitor connection hole CPCH and may be in contact with a part of the capacitor electrode CPE through the capacitor connection hole CPCH. The gate electrode GE of the first thin-film transistor T1 may overlap a part of the capacitor connection hole CPCH.

Alternatively, although not shown in the drawings, the capacitor electrode CPE may be exposed without being covered with the gate insulating layer GI. Specifically, according to an embodiment, the capacitor electrode CPE include or is made of a crystallized oxide semiconductor, and thus the etch rate for the etching material is relatively low. Therefore, in a process of forming the electrode conductive layer ECDL on the gate insulating layer GI, the capacitor electrode CPE may not be covered with the gate insulating layer GI. In such an embodiment, the gate electrode GE of the first thin-film transistor T1 extends toward the capacitor electrode CPE and is in contact with the capacitor electrode CPE, to be electrically connected to the capacitor electrode CPE without any capacitor connection hole CPCH.

Accordingly, in such an embodiment the pixel capacitor PC may be formed where the capacitor electrode CPE and the light-blocking electrode LSL overlap each other.

A part of the light-blocking electrode LSL may overlap the capacitor electrode CPE, thereby forming the pixel capacitor PC.

As shown in FIG. 7, the light-blocking conductive layer BCDL may have a double-layer structure including a diffusion barrier layer and a low-resistance layer. In an embodiment, for example, the diffusion barrier layer of the light-blocking conductive layer BCDL may include or be made of titanium (T1), and the low-resistance layer of the light-blocking conductive layer BCDL may include or be made of copper (Cu).

The electrode conductive layer ECDL on the gate insulating layer GI may have a triple-layer structure.

In an embodiment, as shown in FIG. 6, the electrode conductive layer ECDL includes the gate electrode GE, the source electrode SE and the drain electrode DE of the thin-film transistor T1.

The electrode conductive layer ECDL may further include a scan gate line SGL and an initialization gate line IGL extending in the first direction DR1.

The electrode conductive layer ECDL may further include the second pad layer PDL2 of the signal pad SPD.

In an embodiment, as shown in FIG. 7, the electrode conductive layer ECDL may include a first metal layer ML1 disposed on the gate insulating layer GI, a second metal layer ML2 disposed on the first metal layer ML1, and a third metal layer ML3 disposed on the second metal layer ML2.

The first metal layer ML1 is provided to block diffusion of the metal material of the second metal layer ML2 to layers therearound. The first metal layer ML1 may include or be made of titanium (T1).

The second metal layer ML2 is provided to lower the resistance of the electrode conductive layer ECDL and may include or be made of a metal material having a relatively low resistance. In an embodiment, the second metal layer ML2 may include or be made of at least one selected from aluminum (Al), chromium (Cr), gold (Au), nickel (Ni), neodymium (Nd) and copper (Cu). In an embodiment, for example, the second metal layer ML2 may include or be made of copper (Cu).

The third metal layer ML3 may include or be made of ITO to prevent corrosion of the signal pads SPD and facilitate bonding.

The transistor array substrate 10 according to an embodiment may further include an encapsulation layer 14 disposed on the light-emitting element layer 13.

The encapsulation layer 14 may have a structure in which at least one inorganic film and at least one organic film are alternately stacked. In an embodiment, for example, the encapsulation layer 14 may include a first inorganic layer 141 disposed on the light-emitting element layer 13 and made of an inorganic insulating material, an organic layer 142 disposed on the first inorganic layer 141 and made of an organic insulating material, and a second inorganic layer 143 disposed on the first inorganic layer 141, covering the organic layer 142 and made of an inorganic insulating material.

Hereinafter, a method of fabricating the transistor array substrate 10 according to an embodiment of the disclosure will be described.

FIG. 8 is a flowchart for illustrating a method for fabricating a transistor array substrate according to an embodiment of the disclosure. FIGS. 9 to 27 are view for showing processes of FIG. 8.

Referring to FIG. 8, a method of fabricating a transistor array substrate 10 according to an embodiment includes: disposing (i.e., providing or forming) a first semiconductor material layer on a substrate 11 (S13); performing heat treatment on the first semiconductor material layer to form a second semiconductor material layer in a crystalline phase by the heat treatment (S14); disposing a gate insulating layer GI covering the second semiconductor material layer on the substrate 11 (S15); partially removing the gate insulating layer GI to form a first auxiliary hole and a second auxiliary hole (S16); disposing an electrode conductive layer ECDL on the gate insulating layer GI (S17); and forming an active layer ACT by partially removing the gate insulating layer GI and making a part of the second semiconductor material layer conductive using the electrode conductive layer ECDL as a mask (S18).

In addition, the method of fabricating the transistor array substrate 10 according to an embodiment may further include prior to the process S13 of disposing the first semiconductor material layer, disposing a light-blocking conductive layer BCDL on the substrate 11 (S11), and disposing a buffer layer 121 covering the light-blocking conductive layer BCDL on the substrate 11 (S12).

The method of fabricating the transistor array substrate 10 according to an embodiment may further include, after the process S18 of the forming the active layer ACT, disposing an interlayer dielectric layer 122 covering the electrode conductive layer ECDL and the active layer ACT, and disposing a planarization layer 123 covering the interlayer dielectric layer 122 (S19).

In addition, the method of fabricating the transistor array substrate 10 according to an embodiment may further include, after the process S19 of disposing the interlayer dielectric layer 122 and the planarization layer 123, forming an anode contact hole ANCH through the interlayer dielectric layer 122 and the planarization layer 123 (S21), and disposing an encapsulation layer 140 on a light-emitting element layer 13.

Figure 9:
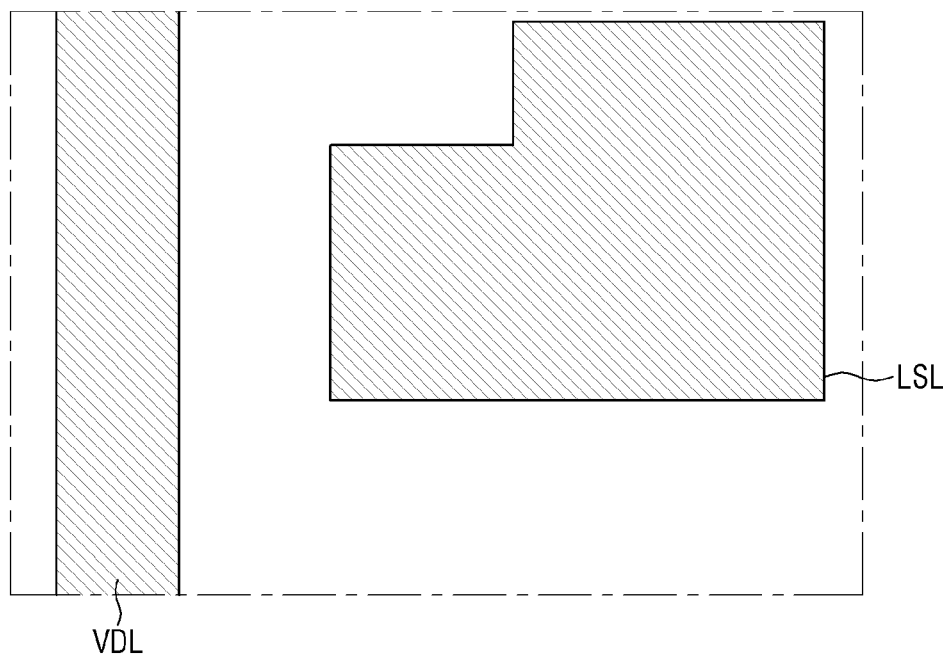
FIGS. 9 to 27 are view for showing processes of FIG. 8.
Figure 10:
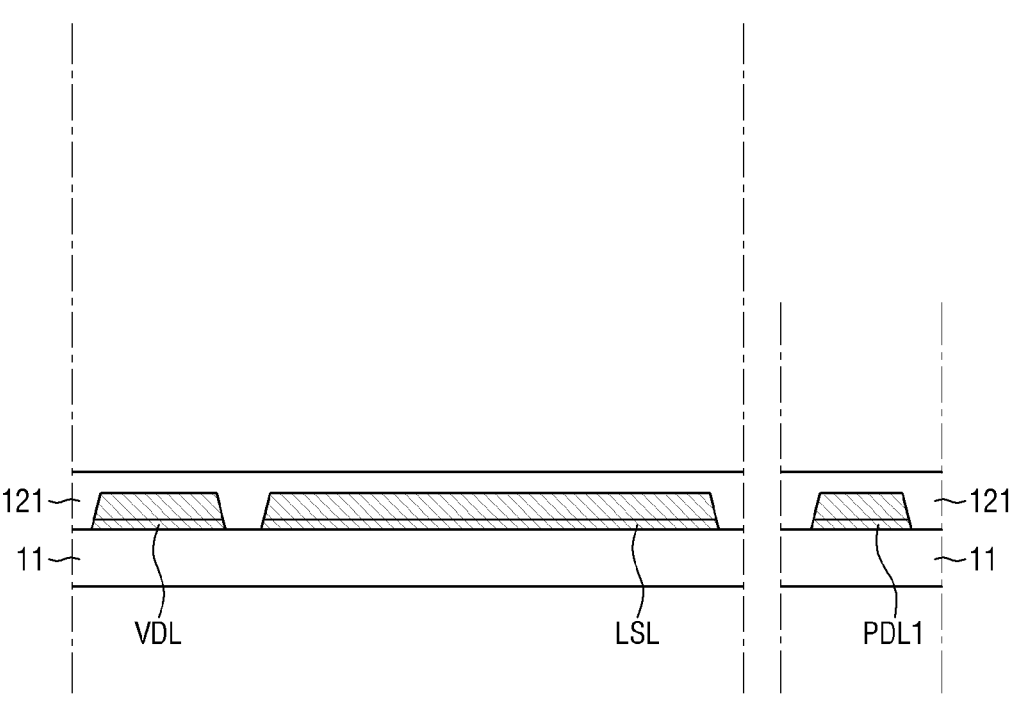

Referring to FIGS. 9 and 10, a substrate 11 including a display area DA and a non-display area NDA (on which the display area DA and the non-display area NDA are defined) may be prepared, and then a light-blocking conductive layer BCDL (VDL and LSL) may be disposed (i.e., provided or formed) on the substrate 11 (S11).

The light-blocking conductive layer BCDL may include a light-blocking electrode LSL disposed on each sub-pixel PX.

In addition, the light-blocking conductive layer BCDL may further include the lines in the second direction DR2 which are disposed in the display area DA and extending in the second direction DR2. The lines in the second direction DR2 may include a data line DL, a first supply voltage line VDL, and an initialization voltage line VIL.

Subsequently, as shown in FIG. 10, a buffer layer 121 may be disposed by stacking an inorganic insulating material covering the light-blocking conductive layer BCDL on the substrate 11 (S12).

Figure 11:
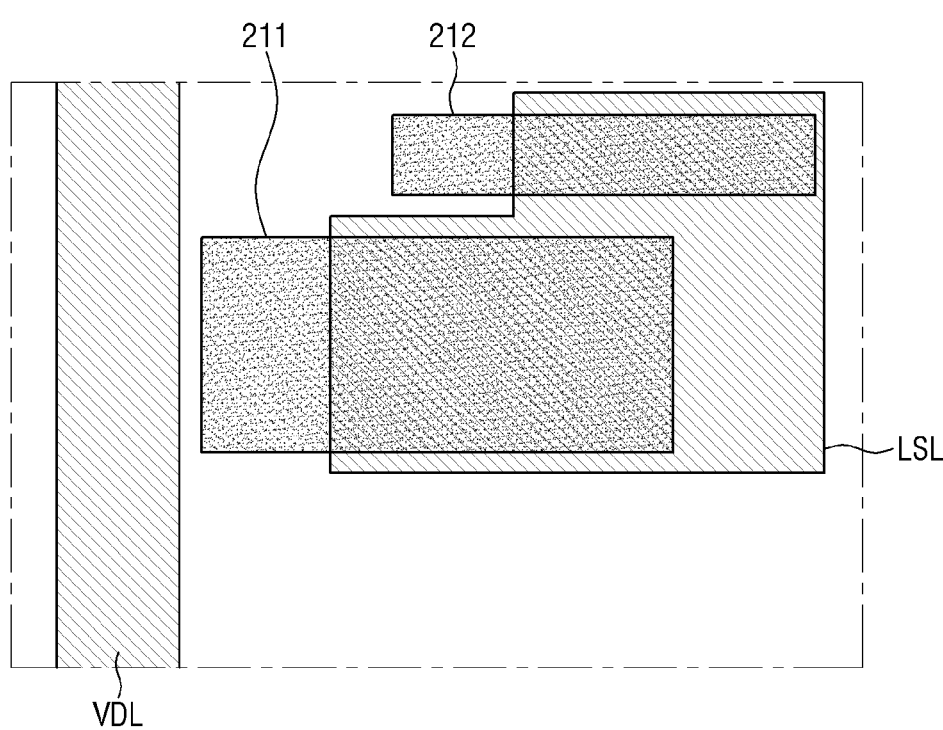
Figure 12:
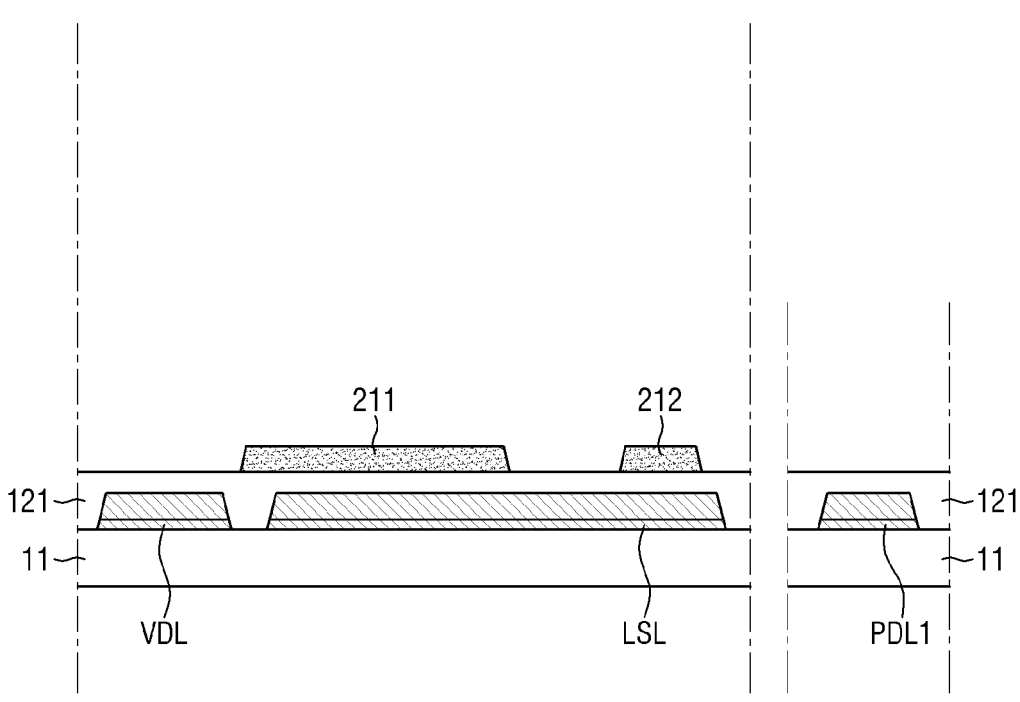

Referring to FIGS. 11 and 12, a first semiconductor material layer 211 may be disposed in each of the sub-pixels PX by stacking an oxide semiconductor in an amorphous phase on the buffer layer 121 and partially removing the oxide semiconductor in the amorphous phase (S13).

The oxide semiconductor of the first semiconductor material layer 211 may include at least one metal material selected from indium (In), gallium (Ga), zinc (Zn), tin (Sn), aluminum (Al), and molybdenum (Mo).

In this process, a first capacitor electrode material layer 212 may be further disposed in each of the sub-pixels PX.

Figure 13:
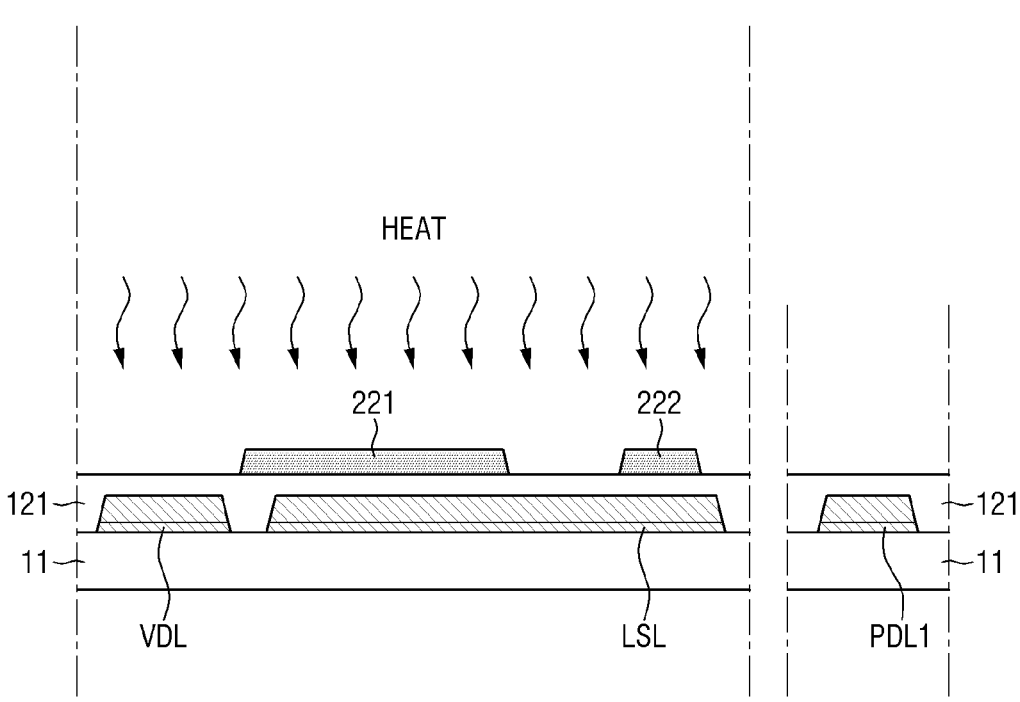

Referring to FIG. 13, heat treatment HEAT may be performed on the first semiconductor material layer 211 to provide a second semiconductor material layer 221 including crystals by the heat treatment (S14).

In this process, as the first capacitor electrode material layer 212 is also exposed to the heat treatment, the second capacitor electrode material layer 222 including crystals obtained by the heat treatment may be formed together.

The heat treatment on the first semiconductor material layer 211 and the first capacitor electrode material layer 212 may be conducted at a temperature between about 300 degrees Celsius and about 450 degrees Celsius. The heat treatment may be conducted for a process time of less than 1 hour.

Depending on the process temperature and process time of the heat treatment, at least a part of each of the first semiconductor material layer 211 and the first capacitor electrode material layer 212 may transform into a crystalline phase.

In such an embodiment, for example, as the process temperature increases or the process time increases, more parts of each of the first semiconductor material layer 211 and the first capacitor electrode material layer 212 may transform into a crystalline phase.

In an embodiment, for example, only upper portion of each of the first semiconductor material layer 211 and the first capacitor electrode material layer 212 may transform into the crystalline phase. In such an embodiment, a part of the upper portion of the first semiconductor material layer 211 and a part of the upper portion of the first capacitor electrode material layer 212 may transform into the crystalline phase to form the second semiconductor material layer 221 and the second capacitor electrode material layer 222, respectively, while the remaining lower portions may be maintained in the amorphous phase.

Figure 14:
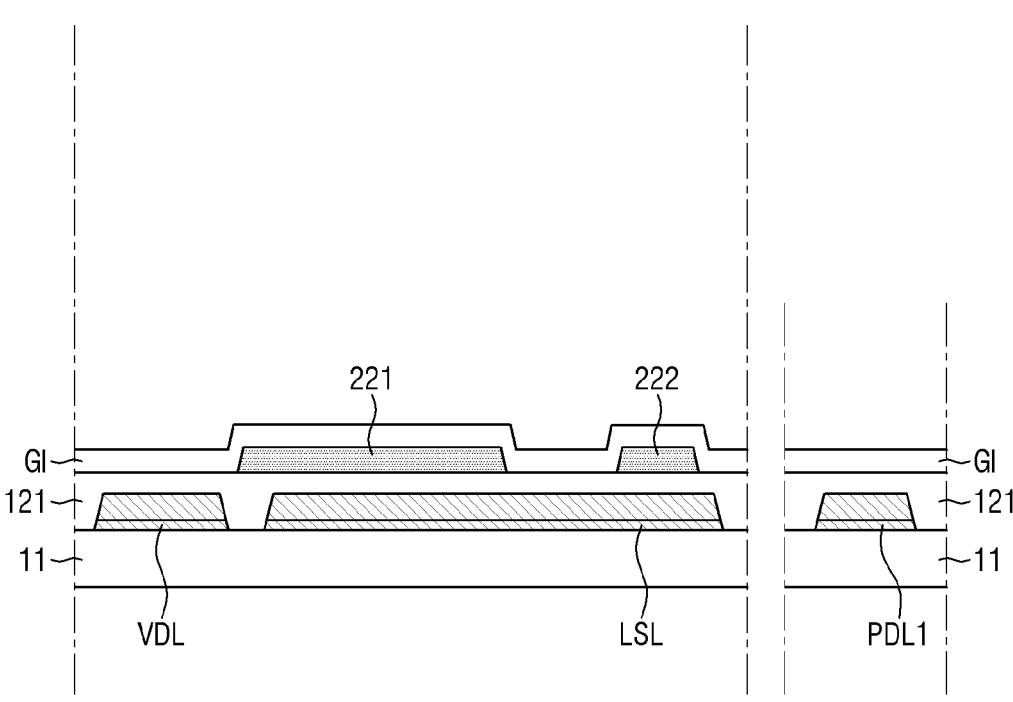

Referring to FIG. 14, a gate insulating layer GI may be disposed on the buffer layer 121 by providing an inorganic insulating material covering the second semiconductor material layer 221 (S15).

The gate insulating layer GI may further cover the second capacitor electrode material layer 222.

Figure 15:
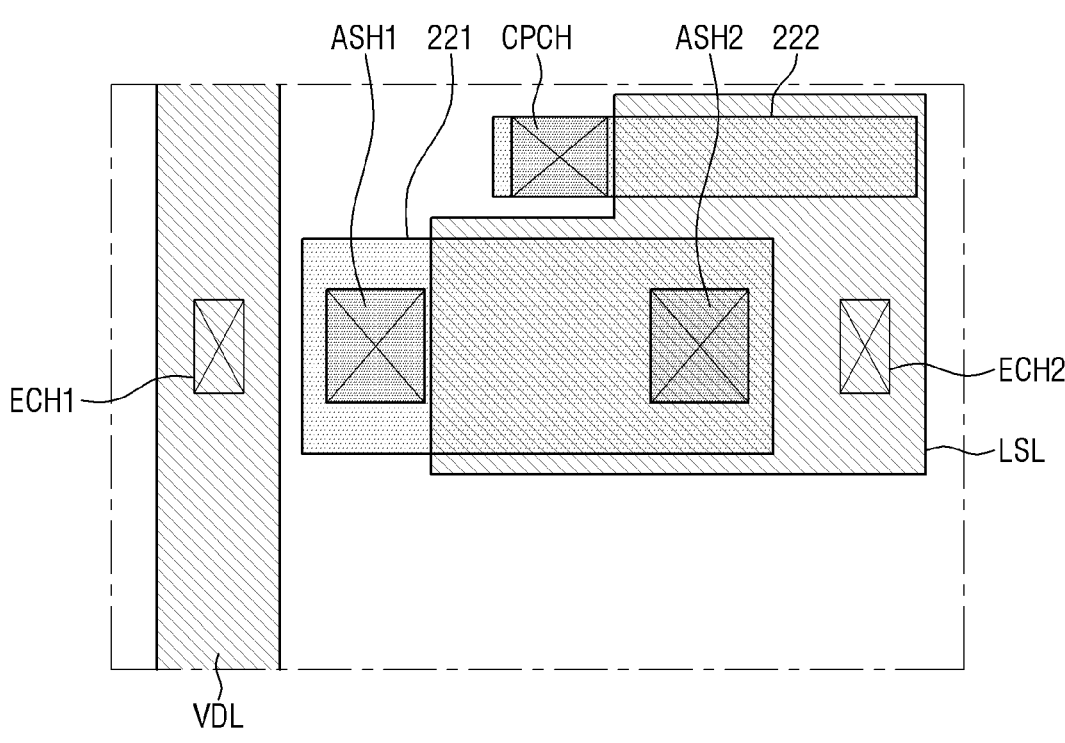
Figure 16:
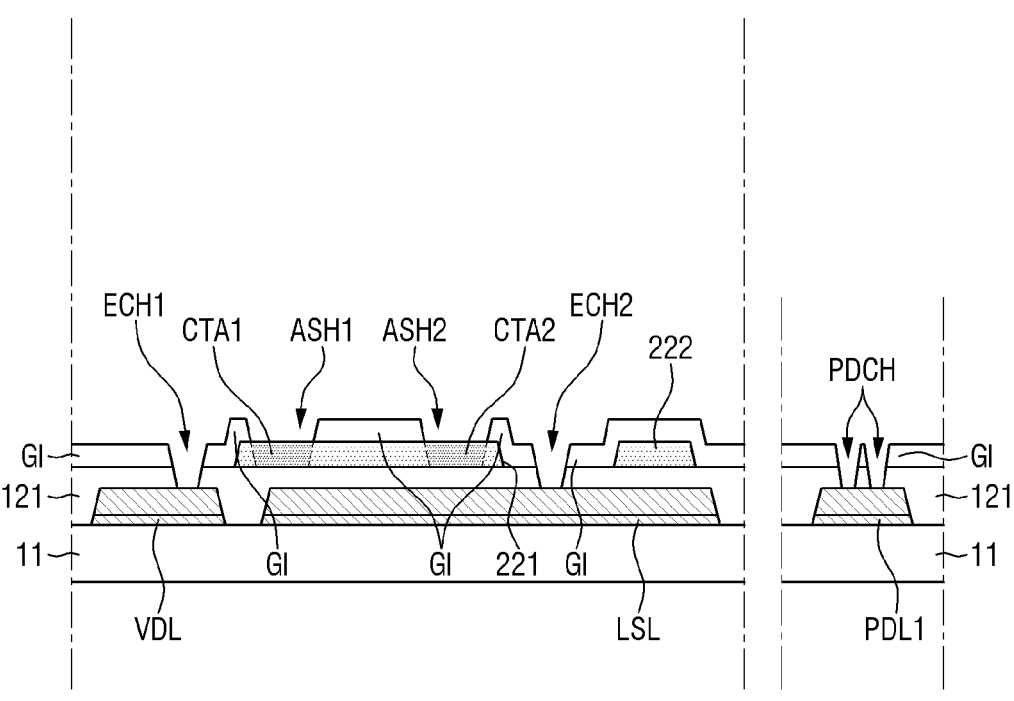

Referring to FIGS. 15 and 16, by partially removing the gate insulating layer GI, a first auxiliary hole ASH1 and a second auxiliary hole ASH2 respectively adjacent to opposing ends of the second semiconductor material layer 221 may be formed (S16).

In an embodiment, by performing an etching process on the gate insulating layer GI to partially remove the gate insulating layer GI, the first auxiliary hole ASH1 and the second auxiliary hole ASH2 may be formed.

During the etching process for the gate insulating layer GI, the parts of the second semiconductor material layer 221 in line with the first auxiliary hole ASH1 and the second auxiliary hole ASH2, respectively, may be exposed during the etching process for partially removing the gate insulating layer GI through the first auxiliary hole ASH1 and the second auxiliary hole ASH2 and may become conductive. As a result, a first contact assist portion CTA1 and a second contact assist portion CTA2 may be formed.

In such an embodiment, after the first auxiliary hole ASH1 and the second auxiliary hole ASH2 are formed in the process S16, the first contact assist portion CTA1 and the second contact assist portion CTA2 of the second semiconductor material layer 221 which are exposed through the first auxiliary hole ASH1 and the second auxiliary hole ASH2, respectively, may be brought into contact with the etching material for partially removing the gate insulating layer GI and may become conductive.

In addition, a capacitor connection hole CPCH that is formed through the gate insulating layer GI and exposes a part of the second capacitor electrode material layer 222 may be further provided in the process S16 of forming the first auxiliary hole ASH1 and the second auxiliary hole ASH2. In this process, a part of the second capacitor electrode material layer 222 may be exposed during the etching process through the capacitor connection hole CPCH to become conductive.

Alternatively, although not shown in the drawings, in the process S16 of forming the first auxiliary hole ASH1 and the second auxiliary hole ASH2, a part of the gate insulating layer GI covering the second capacitor electrode material layer 222 may be removed. In such an embodiment, the entire second capacitor electrode material layer 222 may be exposed during the etching process. At this time, the second capacitor electrode material layer 222 is brought into contact with the etching material for partially removing the gate insulating layer GI and become conductive, thereby forming the capacitor electrode CPE.

In addition, in the process S16 of forming the first auxiliary hole ASH1 and the second auxiliary hole ASH2, a first electrode connection hole ECH1 defined through the gate insulating layer GI and the buffer layer 121 and exposing a part of the first supply voltage line VDL, and a second electrode connection hole ECH2 penetrating the gate insulating layer GI and the buffer layer 121 and exposes a part of the light-blocking electrode LSL may be further formed.

Moreover, as shown in FIG. 16, in the process S16 of forming the first auxiliary hole ASH1 and the second auxiliary hole ASH2, at least one pad connection hole PDCH defined through the gate insulating layer GI and the buffer layer 121 and exposing a part of the first pad layer PDL1 may be further formed.

In an embodiment, for example, the process of partially removing the gate insulating layer GI for the arrangement of the first auxiliary hole ASH1 and the second auxiliary hole ASH2 may be conducted using an etching material containing fluorine (F).

Since the second semiconductor material layer 221 and the second capacitor electrode material layer 222 are crystallized by the heat treatment, the etch rate of the second semiconductor material layer 221 and the second capacitor electrode material layer 222 by the etching material containing fluorine (F) is lower than that of the first semiconductor material layer 211 and the first capacitor electrode material layer 212 in the amorphous phase. Accordingly, even when the second semiconductor material layer 221 and the second capacitor electrode material layer 222 in the crystalline phase are exposed to the etching material containing fluorine (F), the second semiconductor material layer 221 and the second capacitor electrode material layer 222 do not react with the etching material containing fluorine (F) and remain without being removed.

Figure 17:
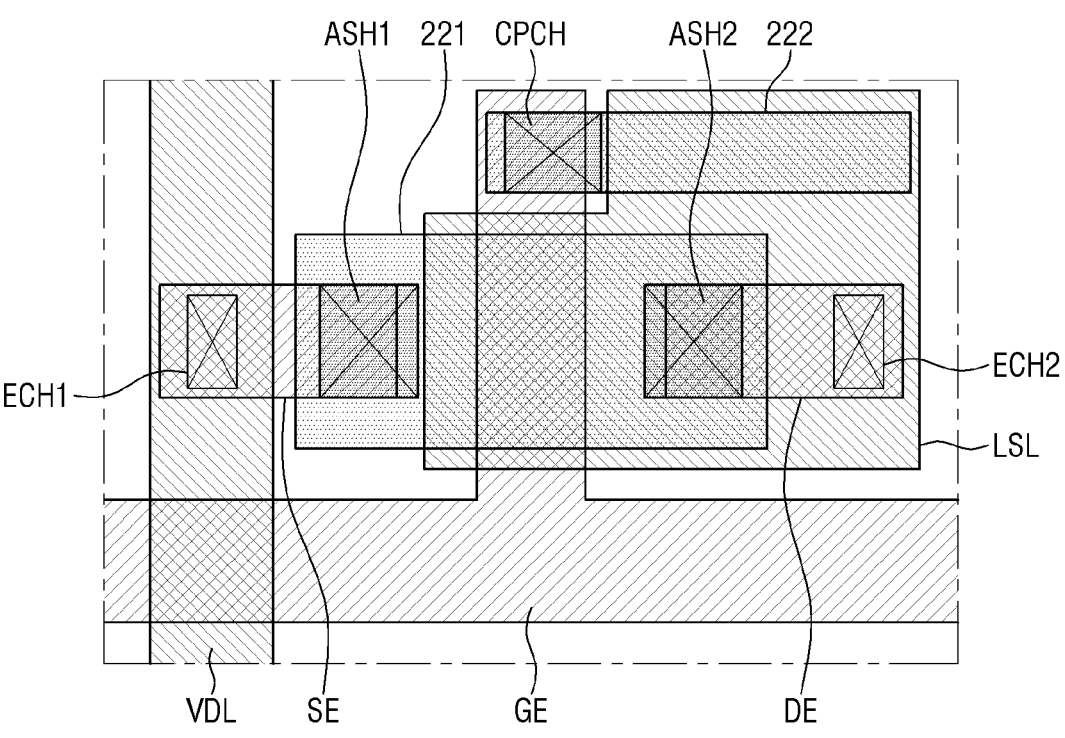
Figure 18:
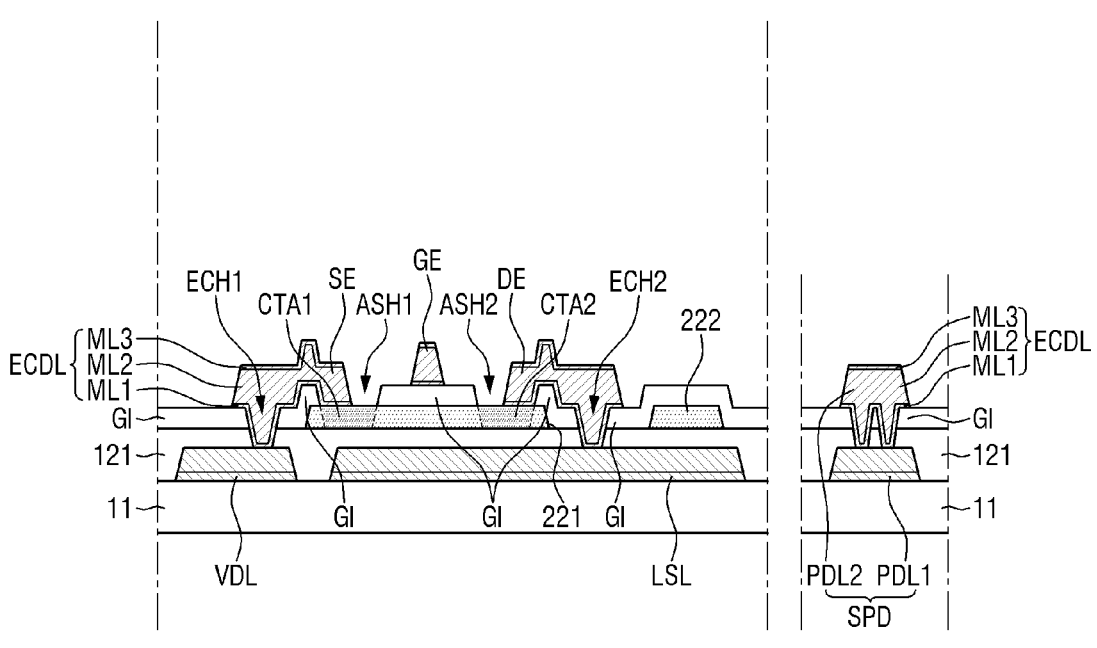

As shown in FIGS. 17 and 18, the stack of the first metal layer ML1, the second metal layer ML2 and the third metal layer ML3 is disposed on the gate insulating layer GI and partially removed, so that an electrode conductive layer ECDL may be disposed (S17).

Specifically, the process S17 of disposing the electrode conductive layer ECDL may include sequentially disposing the first metal layer ML1, the second metal layer ML2 and the third metal layer ML3 on the gate insulating layer GI, and forming the electrode conductive layer ECDL by partially removing the stack of the first metal layer ML1, the second metal layer ML2 and the third metal layer ML3.

The first metal layer ML1 may include titanium (T1).

The second metal layer ML2 may include a metal material having a lower resistance than the resistance of the first metal layer ML1. In an embodiment, the second metal layer ML2 may include at least one selected from aluminum (Al), chromium (Cr), gold (Au), nickel (Ni), neodymium (Nd) and copper (Cu). In an embodiment, for example, the second metal layer ML2 may include copper (Cu).

In an embodiment, the third metal layer ML3 may include ITO.

Accordingly, the process of partially removing the stack on the first metal layer ML1, the second metal layer ML2 and the third metal layer ML3 may be conducted using an etching material containing fluorine (F).

In an embodiment, for example, the etching material in the process of partially removing the stack on the first metal layer ML1, the second metal layer ML2 and the third metal layer ML3 may include or contain at least one selected from hydrogen peroxide ($H_2O_2$), sulfuric acid ($H_2SO_4$), phosphoric acid ($H_3O_4P$), nitric acid ($HNO_3$) and acetic acid ($CH_3COOH$), in addition to fluorine (F).

The content of fluorine in the etching material may be about 5% or less. In the etching material, the content of hydrogen peroxide may be about 30% or less, the content of sulfuric acid may be about 10% or less, the content of phosphoric acid may be about 60% or less, the content of nitric acid may be about 30% or less, and the content of acetic acid may be about 10% or less. It should be understood, however, that the disclosure is not limited thereto. The components and composition ratio of the etching material according to the embodiment are not limited thereto.

In an embodiment, as described above, the etch rate of the second semiconductor material layer 221 and the second capacitor electrode material layer 222 for the etching material containing fluorine (F) is lower than that of the first semiconductor material layer 211 and the first capacitor electrode material layer 212 in the amorphous phase. Therefore, even in a case where the etching material for partially removing the stack of the first metal layer ML1, the second metal layer ML2 and the third metal layer ML3 contains fluorine (F), the second semiconductor material layer 221 and the second capacitor electrode material layer 222 (or capacitor electrode CPE) may remain without reacting with the etching material.

The electrode conductive layer ECDL may include a gate electrode GE overlapping a part of the central portion of the second semiconductor material layer 221, a source electrode SE overlapping one side of the second semiconductor material layer 221, and a drain electrode DE overlapping an opposite side of the second semiconductor material layer 221.

The source electrode SE may extend to the first auxiliary hole ASH1 and may be in contact with the first contact assist portion CTA1 of the second semiconductor material layer 221 through the first auxiliary hole ASH1.

The drain electrode DE may extend to the second auxiliary hole ASH2 and may be in contact with the second contact assist portion CTA2 of the second semiconductor material layer 221 through the second auxiliary hole ASH2.

The source electrode SE and the drain electrode DE do not entirely cover the first auxiliary hole ASH1 and the second auxiliary hole ASH2, respectively. In such an embodiment, the remaining portions of the second semiconductor material layer 221 except for the first contact assist portion CTA1 and the second contact assist portion CTA2 are covered with the gate insulating layer GI, thereby not being electrically connected to the source electrode SE and the drain electrode DE.

In such an embodiment, the source electrode SE may overlap a part of the first auxiliary hole ASH1 and may be in contact with a part of the first contact assist portion CTA1. In such an embodiment, the drain electrode DE may overlap a part of the second auxiliary hole ASH2 and may be in contact with a part of the second contact assist portion CTA2.

In addition, the gate electrode GE of the first thin-film transistor T1 may extend to come into contact with a part of the capacitor electrode CPE, so that the gate electrode GE may be electrically connected to the capacitor electrode CPE.

The source electrode SE of the first thin-film transistor T1 may be electrically connected to the first supply voltage line VDL through the first electrode connection hole ECH1.

The drain electrode DE of the first thin-film transistor T1 may be electrically connected to the light-blocking electrode LSL through the second electrode connection hole ECH2.

Figure 19:
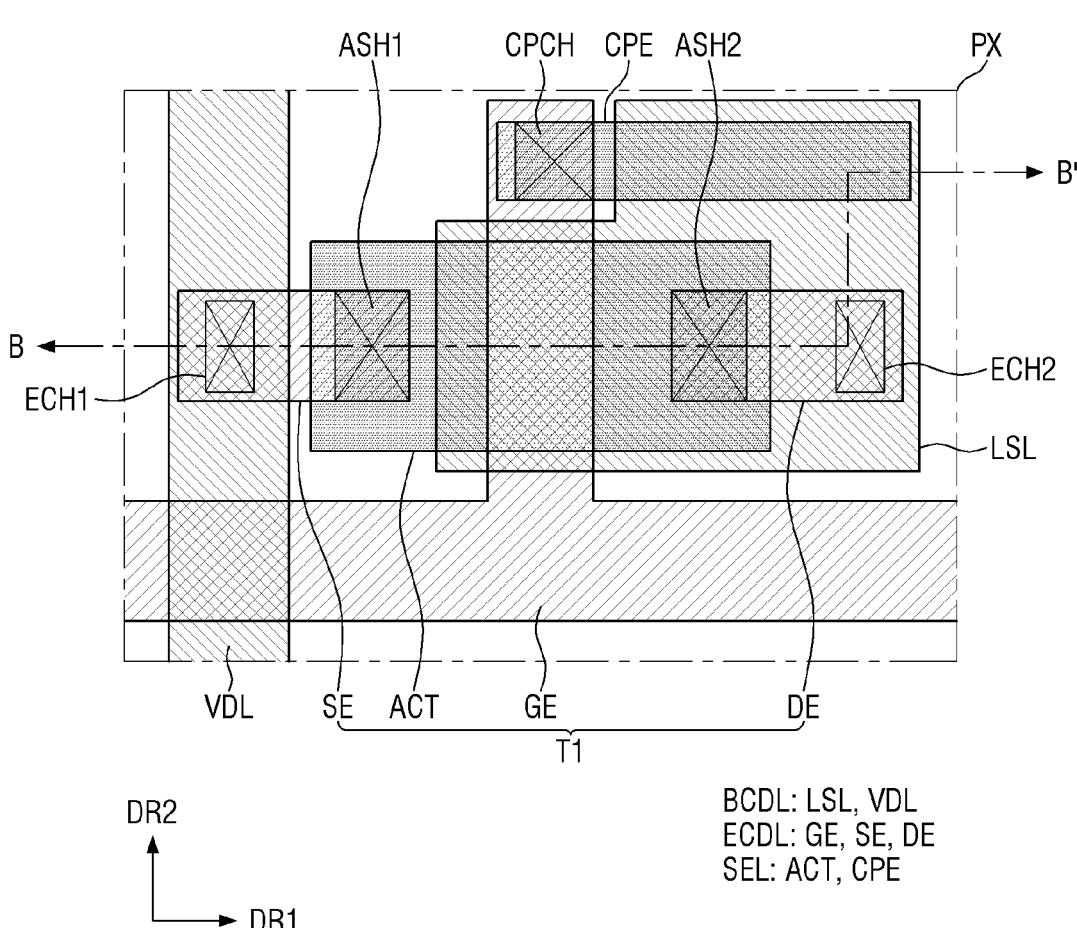
Figure 20:
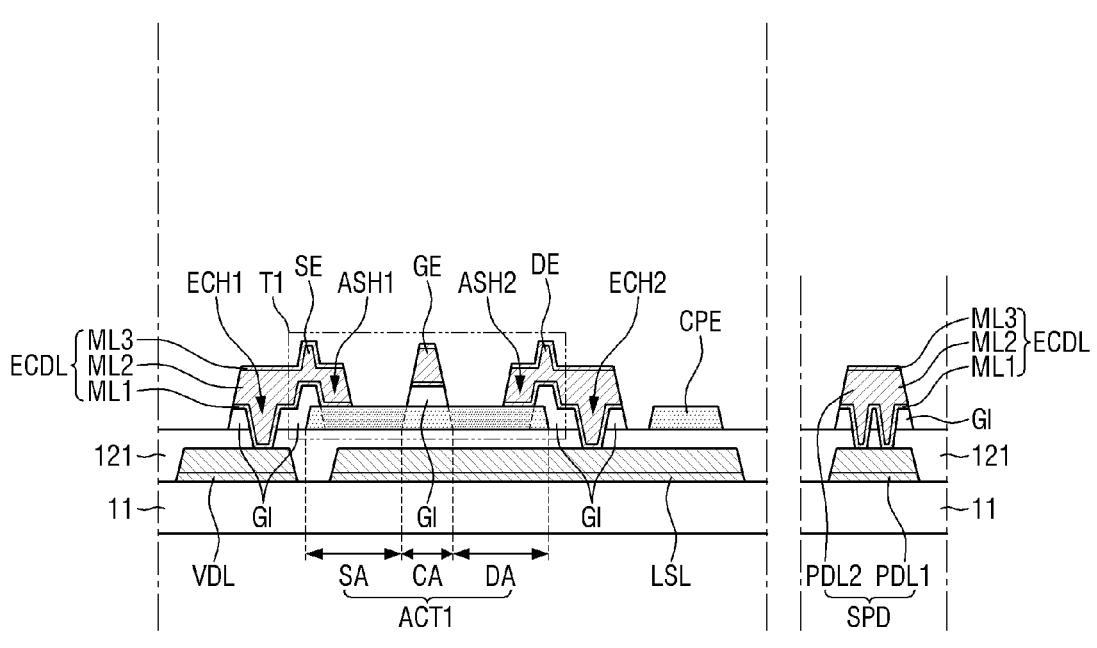

Referring to FIGS. 19 and 20, the gate insulating layer GI is partially removed using the electrode conductive layer ECDL (GE, SE, DE and PDL2) as a mask, and the second semiconductor material layer 221 partially becomes conductive, so that the active layer ACT may be formed (S18).

Specifically, in the process S18 of forming the active layer ACT, the gate insulating layer GI covering the gap areas GA of the second semiconductor material layer 221 between each of the source electrode SE and the drain electrode DE and the gate electrode GE is removed, so that the gap areas GA become conductive. As a result, active layer ACT including the conductive gap areas GA can be formed.

In this manner, the first thin-film transistor T1 including the active layer ACT, the gate electrode GE, the source electrode SE and the drain electrode DE can be fabricated.

In process S18 of forming the active layer ACT, the process of partially removing the gate insulating layer GI may be performed using an etching material containing fluorine (F).

Since the second semiconductor material layer 221 and the second capacitor electrode material layer 222 are crystallized by the heat treatment, the etch rate of the second semiconductor material layer 221 and the second capacitor electrode material layer 222 by the etching material containing fluorine (F) is lower than that of the first semiconductor material layer 211 and the first capacitor electrode material layer 212 in the amorphous phase. That is to say, even when the second semiconductor material layer 221 and the second capacitor electrode material layer 222 in the crystallized phase are exposed to the etching material containing fluorine (F), the second semiconductor material layer 221 and the second capacitor electrode material layer 222 do not react with the etching material containing fluorine (F) and remain.

Therefore, after the process S18 of forming the active layer ACT, the active layer ACT may be disposed in an intact shape in a plan view.

In addition, in the process S18 of forming the active layer ACT, a part of the second capacitor electrode material layer 222 that does not overlap the gate electrode GE of the first thin-film transistor T1 has conductivity or is conductive, that is, a conductivity higher than that of the channel region CA, so that the capacitor electrode CPE may be formed.

Figure 21:
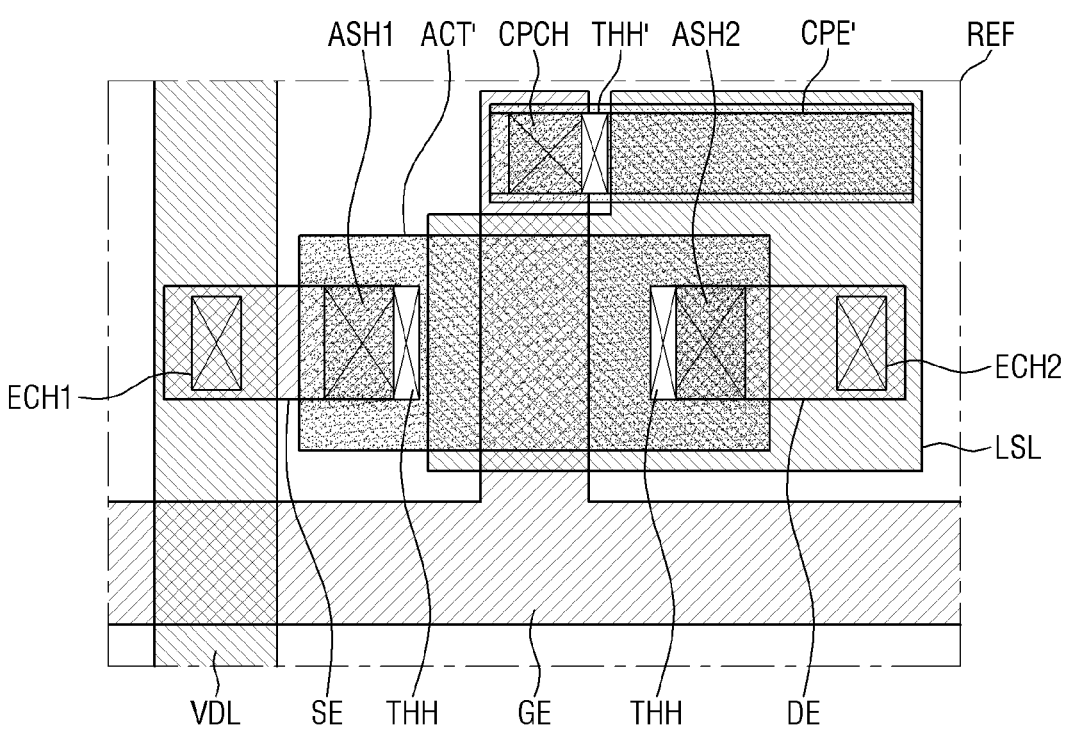
Figure 22:
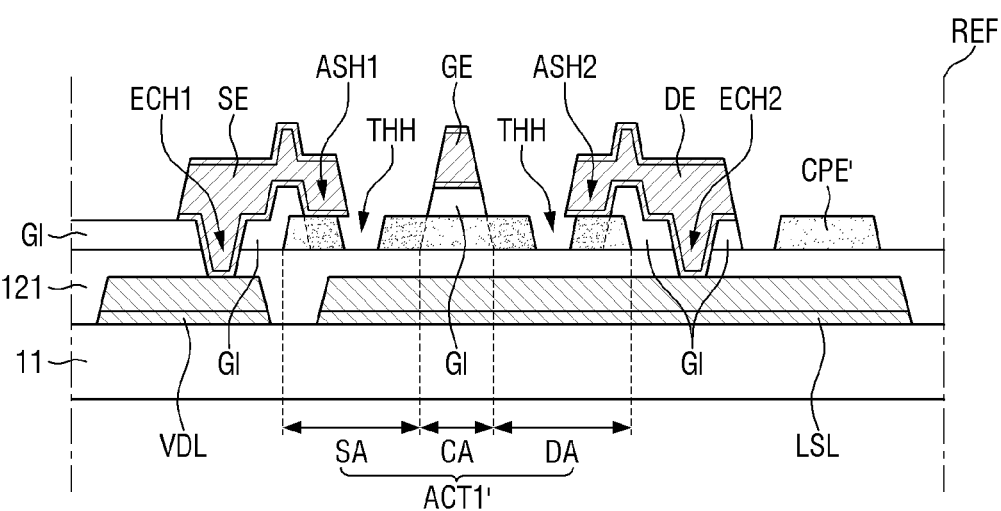

FIGS. 21 and 22 show a comparative example of a transistor array substrate REF.

Referring to FIGS. 21 and 22, the comparative example of the transistor array substrate REF includes an active layer and a capacitor electrode made of an oxide semiconductor in an amorphous phase.

In the comparative example, after a first auxiliary hole ASH1 and a second auxiliary hole ASH2 for electrical connection between each of a source electrode SE and a drain electrode DE and an active layer ACT' are disposed, parts of the active layer ACT' that are exposed by the first auxiliary hole ASH1 and the second auxiliary hole ASH2 and do not overlap the source electrode SE or the drain electrode DE are removed by an etching material during the process of disposing the source electrode SE and the drain electrode DE. Therefore, the active layer ACT' of the comparative example of the transistor array substrate REF includes through holes THH between each of the source electrode SE and the drain electrode DE and the gate electrode GE. Current paths in the active layer ACT' may be deformed or reduced due to such through holes THH of the active layer ACT', and accordingly the reliability and the uniformity of the current characteristics of the thin-film transistors of the comparative example of the transistor array substrate REF may be deteriorated.

In addition, the capacitor electrode CPE' of the comparative example of the transistor array substrate REF also includes a through hole THH' around a capacitor connection hole CPCH. Accordingly, resistance characteristics between the gate electrode GE of the first thin-film transistor T1 and the capacitor electrode CPE' may be increased or varied, and the capacitance of the pixel capacitor PC may be varied.

In an embodiment of the invention, as described above, the method of fabricating the transistor array substrate 10 includes the process S14 of performing heat treatment on the first semiconductor material layer 211 in the amorphous phase to form the second semiconductor material layer 221 in the crystalline phase. In such an embodiment, compared to the first semiconductor material layer 211 in the amorphous phase, the second semiconductor material layer 221 in the crystalline phase may be relatively less etched by the etching material containing fluorine (F).

Accordingly, in such an embodiment, even when the second semiconductor material layer 221 is exposed to the etching material one or more times due to the structure in which the source electrode SE and the drain electrode DE are disposed in a same layer as the gate electrode GE, the second semiconductor material layer 221 may remain as it is. As a result, the active layer ACT may be disposed in an intact shape in a plan view, and thus the reliability and the uniformity of current characteristics of the thin-film transistor T1 can be improved.

As described above, according to an embodiment, as the source electrode SE and the drain electrode DE are disposed in or directly on a same layer as the gate electrode GE, the number of mask processes can be reduced, and the active layer ACT can be disposed in the intact shape in a plan view.

In such an embodiment, since the capacitor electrode CPE can be disposed in the intact shape in a plan view, the uniformity of resistance characteristics between the gate electrode GE of the first thin-film transistor T1 and the capacitor electrode CPE' can be improved, and the uniformity of the capacity of the pixel capacitor PC can be improved.

Figure 23:
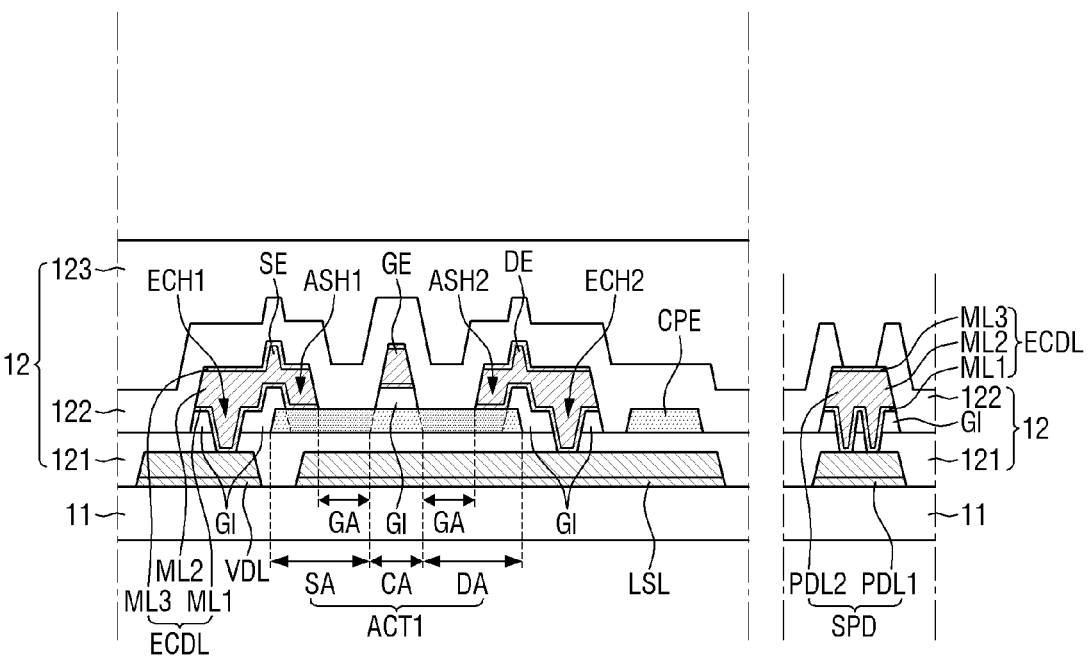

Subsequently, referring to FIG. 23, an interlayer dielectric layer 122 may be disposed by applying an inorganic insulating material covering the thin-film transistor T1 on the buffer layer 121. Subsequently, by applying an organic insulating material on the interlayer dielectric layer 122 except for the display pad area DPA, a planarization layer 123 may be disposed (S19).

The interlayer dielectric layer 122 may include or be made up of multiple films in which one or more inorganic films of silicon nitride, silicon oxynitride, silicon oxide, titanium oxide and aluminum oxide are alternately stacked on one another.

The planarization layer 123 may be formed as or defined by an organic film including an organic material such as an acryl resin, an epoxy resin, a phenolic resin, a polyamide resin and a polyimide resin.

Figure 24:
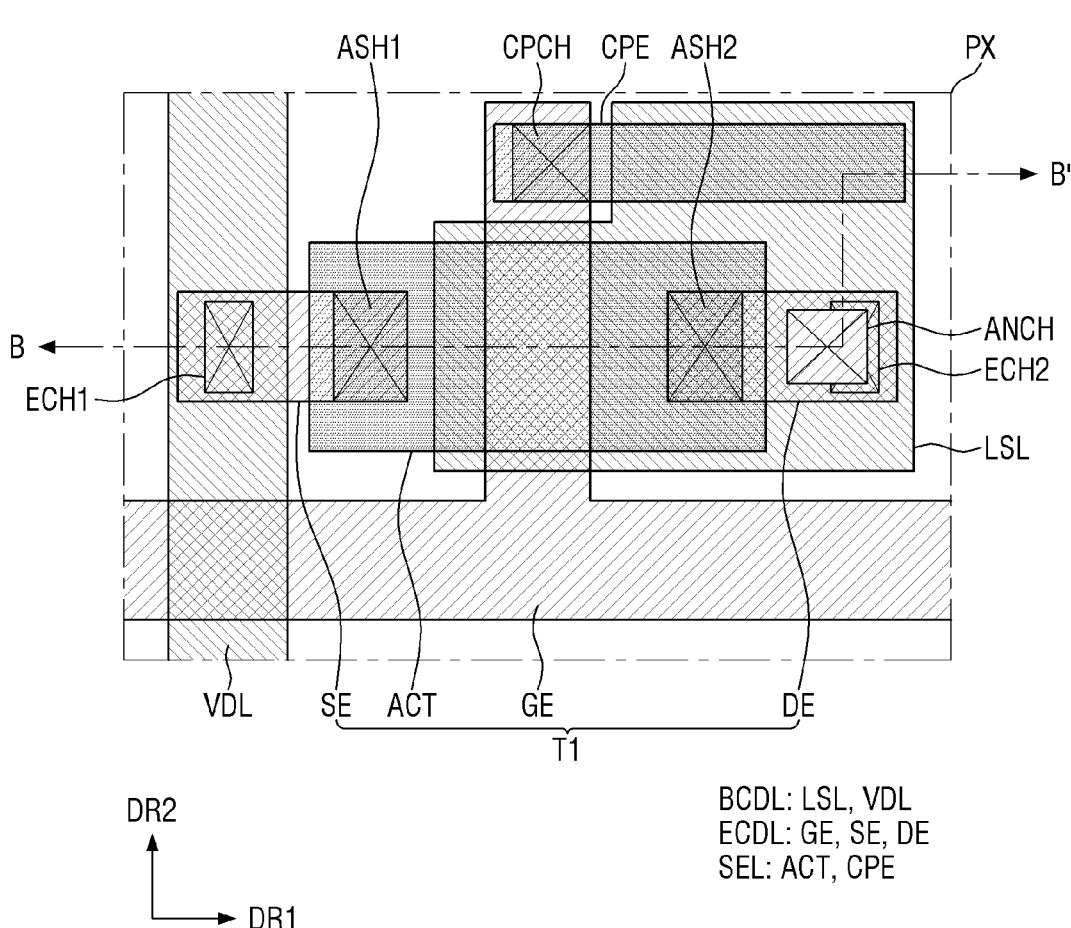
Figure 25:
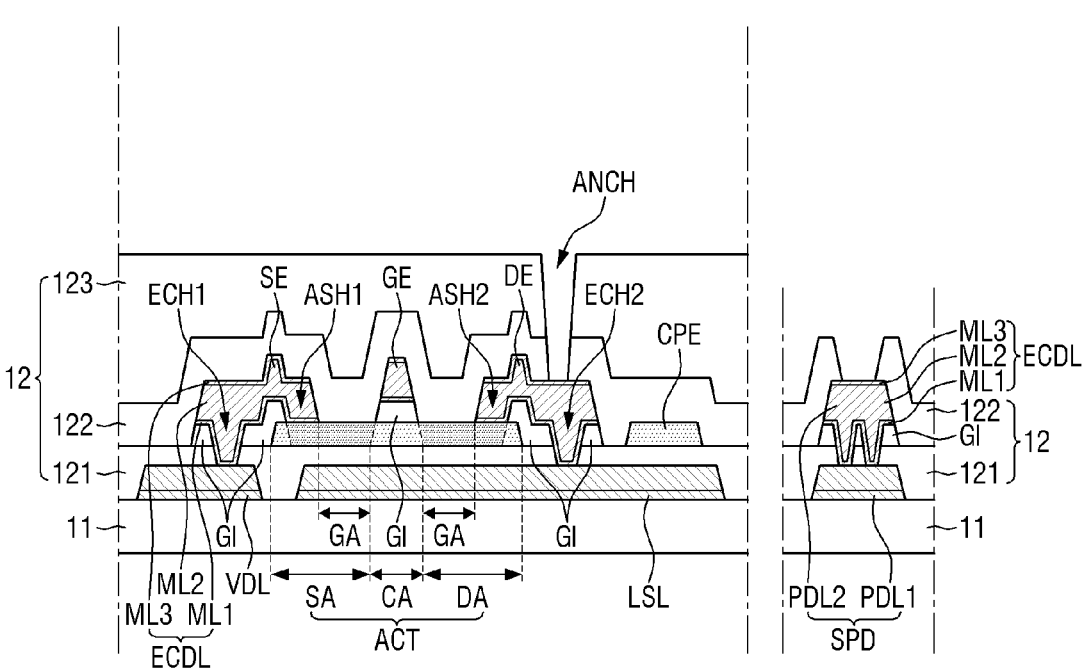

Referring to FIGS. 24 and 25, the interlayer dielectric layer 122 and the planarization layer 123 are partially removed, so that an anode contact hole ANCH that is defined through the interlayer dielectric layer 122 and the planarization layer 123 and exposes a part of the drain electrode DE of the first thin-film transistor T1 is formed (S21).

Figure 26:
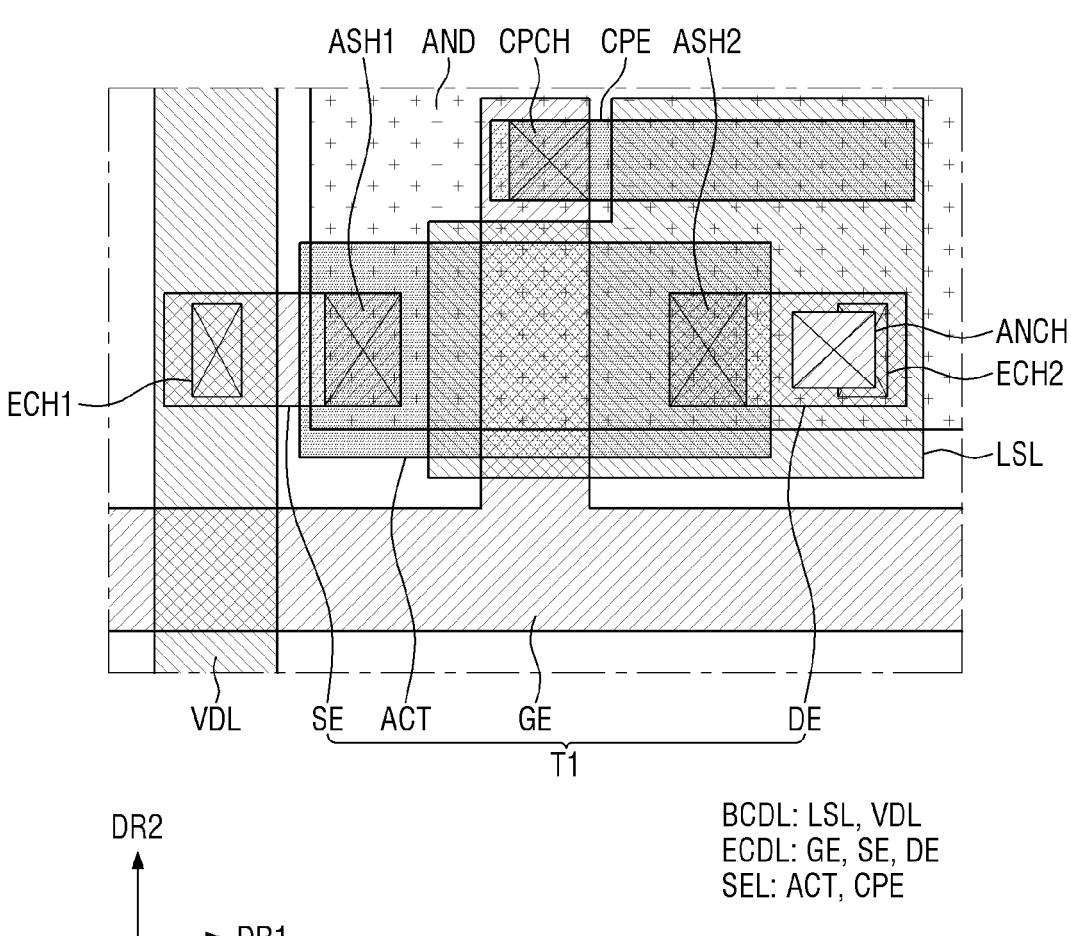
Figure 27:
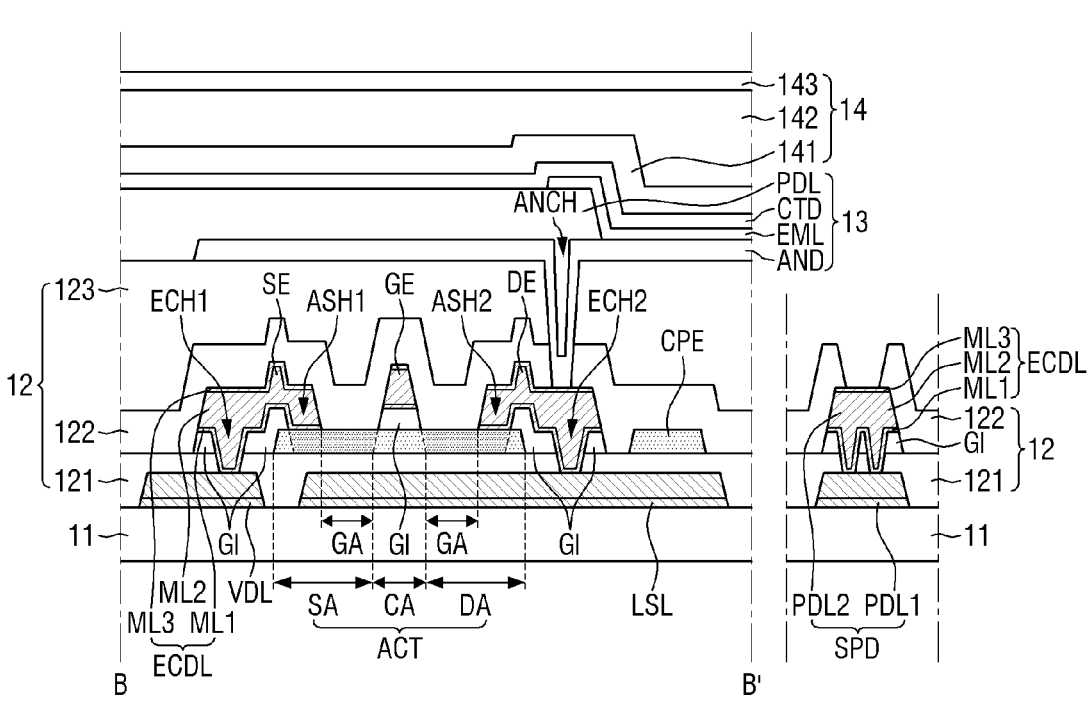

Referring to FIGS. 26 and 27, a light-emitting element layer 13 may be disposed on the planarization layer 123 (S22).

The light-emitting element layer 13 may include an anode electrode AND electrically connected to the first thin-film transistor T1 through an anode contact hole ANCH, a pixel-defining layer PDL disposed between the anode electrodes AND of the sub-pixels PX, an emissive layer EML disposed on the anode electrode AND, and a cathode electrode CTD disposed on the emissive layer EML.

The anode electrode AND may be a pixel electrode disposed in each of the sub-pixels PX. The anode electrode AND may reflect at least some of the lights generated in the emissive layer EML.

The cathode electrode CTD may be a common electrode provided across all of the sub-pixels PX. The cathode electrode CTD may transmit at least some of the lights generated in the emissive layer EML.

The emissive layer EML may be disposed in each of the sub-pixels PX. In an alternative embodiment, where the display device 1 includes a color filter member (not shown) or a color conversion member (not shown) or displays a single color, the emissive layer EML may be equally disposed in all sub-pixels PX.

Subsequently, an encapsulation layer 14 may be disposed on the light-emitting element layer 13 (S23).

In this manner, the transistor array substrate 10 according to an embodiment may be fabricated.

As described above, the method according to an embodiment includes the process S17 of disposing the electrode conductive layer ECDL including the gate electrode GE, the source electrode SE and the drain electrode DE, such that the number of mask processes can be reduced.

In addition, the method according to an embodiment includes the process S14 of forming the second semiconductor material layer 221 crystallized by heat treatment, so that the active layer ACT in an intact shape in a plan view can be formed. Therefore, it is possible to reduce the number of mask processes without compromising the uniformity and the reliability of current characteristics of the thin-film transistors.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A thin-film transistor comprising:
a substrate;
an active layer disposed on the substrate and comprising a channel region, a source region connected to one side of the channel region, and a drain region connected to an opposite side of the channel region;
a gate insulating layer disposed on a part of the active layer;
a gate electrode overlapping the channel region of the active layer and defined by a first portion of an electrode conductive layer which is disposed on the gate insulating layer;
a source electrode defined by a second portion of the electrode conductive layer and in contact with a part of the source region of the active layer; and
a drain electrode defined by a third portion of the electrode conductive layer and in contact with a part of the drain region of the active layer,
wherein the active layer comprises an oxide semiconductor including crystals and is disposed as an island shape excluding a hole in a plan view.

2. The thin-film transistor of claim 1, wherein the electrode conductive layer comprises:
a first metal layer disposed on the gate insulating layer and comprising titanium (Ti);
a second metal layer disposed on the first metal layer and comprising a metal material having a resistance lower than a resistance of titanium (Ti); and
a third metal layer disposed on the second metal layer and comprising indium tin oxide (ITO).

3. The thin-film transistor of claim 1, wherein the active layer comprises a first gap area between the source electrode and the gate electrode, and a second gap area between the drain electrode and the gate electrode, and wherein the first gap area and the second gap area are integrally formed with the channel region as a single unitary and indivisible part.

4. The thin-film transistor of claim 3, wherein the active layer is disposed on a buffer layer covering the substrate,
wherein the gate electrode, the source electrode and the drain electrode are covered with an interlayer dielectric layer, and
wherein entire of the first gap area and entire of the second gap area are in contact with the interlayer dielectric layer and disposed between the interlayer dielectric layer and the buffer layer.

5. The thin-film transistor of claim 3, wherein at least a part of the active layer except for the channel region has conductivity.

6. The thin-film transistor of claim 5, wherein each of the first gap area and the second gap area has conductivity.

7. A transistor array substrate comprising:
a substrate comprising a display area in which sub-pixels are arranged and a non-display area around the display area; and
a circuit layer disposed on the substrate and comprising pixel drivers associated with the sub-pixels, respectively,
wherein each of the pixel drivers comprises a thin-film transistor in the circuit layer,
wherein the thin-film transistor comprises:
an active layer disposed on the substrate and comprising a channel region, a source region connected to one side of the channel region, and a drain region connected to an opposite side of the channel region;
a gate insulating layer disposed on a part of the active layer;
a gate electrode overlapping the channel region of the active layer and defined by a first portion of an electrode conductive layer which is disposed on the gate insulating layer;
a source electrode defined by a second portion of the electrode conductive layer and in contact with a part of the source region of the active layer; and
a drain electrode defined by a third portion of the electrode conductive layer and in contact with a part of the drain region of the active layer,
wherein the circuit layer further comprises:
a buffer layer disposed on the substrate and covering a light-blocking conductive layer; and
an interlayer dielectric layer disposed on the buffer layer and covering the thin-film transistor;
wherein the active layer comprises an oxide semiconductor including crystals,
wherein the active layer comprises a first gap area between the source electrode and the gate electrode, and a second gap area between the drain electrode and the gate electrode, and
wherein entire of the first gap area and entire of the second gap area are in contact with the interlayer dielectric layer and disposed between the interlayer dielectric layer and the buffer layer.

8. The transistor array substrate of claim 7, wherein the first gap area and the second gap area are integrally formed with the channel region as a single unitary and indivisible part.

9. The transistor array substrate of claim 7, wherein the circuit layer further comprises
a light-blocking electrode overlapping at least the channel region of the active layer and comprised in a light-blocking conductive layer which is disposed on the substrate and covered by the buffer layer; and a planarization layer disposed on the interlayer dielectric layer.

10. The transistor array substrate of claim 9, wherein at least a part of the active layer except for the channel region has conductivity.

11. The transistor array substrate of claim 10, wherein each of the first gap area and the second gap area has conductivity.

12. The transistor array substrate of claim 9, wherein the electrode conductive layer comprises:

a first metal layer disposed on the gate insulating layer and comprising titanium (Ti);

a second metal layer disposed on the first metal layer and comprising a metal material having a resistance lower than a resistance of titanium (Ti); and a third metal layer disposed on the second metal layer and comprising indium tin oxide (ITO).

13. The transistor array substrate of claim 12, wherein the circuit layer further comprises a signal pad disposed in a part of the non-display area, and wherein the signal pad comprises:

a first pad layer disposed in a same layer as the light-blocking conductive layer; and a second pad layer disposed in a same layer as the electrode conductive layer and electrically connected to the first pad layer.

14. The transistor array substrate of claim 9, further comprising:

a light-emitting element layer disposed on the circuit layer and comprising light-emitting elements electrically connected to the pixel drivers, respectively, wherein the circuit layer further comprises:

a scan gate line which transmits a scan signal to the pixel drivers;

a data line which transmits a data signal to the pixel drivers; and an initialization voltage line which transmits an initialization voltage to the pixel drivers, and wherein one of the pixel drivers comprises:

a first thin-film transistor connected in series with one of the light-emitting elements between a first supply voltage line and a second supply voltage line which respectively transmits a first supply voltage and a second supply voltage for driving the light-emitting elements;

a second thin-film transistor electrically connected between the data line and a gate electrode of the first thin-film transistor and turned on in response to the scan signal of the scan gate line;

a pixel capacitor electrically connected between a first node and a second node, wherein the first node is connected between the gate electrode of the first thin-film transistor and the second thin-film transistor, and the second node is connected between the first thin-film transistor and the light-emitting element; and a third thin-film transistor electrically connected between the initialization voltage line and the second node and turned on in response to an initialization control signal of an initialization gate line.

15. The transistor array substrate of claim 14, wherein the first supply voltage line is comprised in the light-blocking conductive layer, wherein one of the source electrode and the drain electrode of the first thin-film transistor is electrically connected to the first supply voltage line through a first electrode connection hole defined through the gate insulating layer and the buffer layer, and wherein the other of the source electrode and the drain electrode of the first thin-film transistor is electrically connected to the light-blocking electrode through a second electrode connection hole defined through the gate insulating layer and the buffer layer.

16. The transistor array substrate of claim 15, wherein the light-emitting element comprises an anode electrode disposed on the planarization layer and electrically connected to the first thin-film transistor through an anode contact hole defined through the planarization layer and the interlayer dielectric layer.

17. The transistor array substrate of claim 14, wherein the circuit layer further comprises a capacitor electrode is disposed in a same layer as the active layer and electrically connected to the gate electrode of the first thin-film transistor, and wherein portions of the capacitor electrode and the light-blocking electrode overlapping each other define the pixel capacitor.

18. A method of fabricating a transistor array substrate, the method comprising:

disposing a first semiconductor material layer comprising an oxide semiconductor in an amorphous phase on a substrate;

performing heat treatment on the first semiconductor material layer to form a second semiconductor material layer in a crystalline phase by the heat treatment;

disposing a gate insulating layer covering the second semiconductor material layer on the substrate;

partially removing the gate insulating layer to form a first auxiliary hole and a second auxiliary hole adjacent to opposing ends of the second semiconductor material layer, respectively;

disposing an electrode conductive layer on the gate insulating layer; and forming an active layer by partially removing the gate insulating layer and making a part of the second semiconductor material layer conductive using the electrode conductive layer as a mask.

19. The method of claim 18, wherein the performing the heat treatment on the first semiconductor material layer comprises performing the heat treatment at a temperature between about 300 degrees Celsius and about 450 degrees Celsius.

20. The method of claim 19, wherein the partially removing the gate insulating layer comprises using an etching material comprising fluorine (F), wherein an etch rate of the second semiconductor material layer for the etching material comprising fluorine (F) is lower than an etch rate of the first semiconductor material layer, and wherein the active layer is disposed as an island shape excluding a hole in a plan view after the forming the active layer.

21. The method of claim 20, wherein the disposing the electrode conductive layer comprises:

sequentially disposing a first metal layer comprising titanium (Ti), a second metal layer comprising a metal material having a lower resistance than the first metal layer, and a third metal layer comprising indium tin oxide (ITO) on the gate insulating layer; and forming the electrode conductive layer by partially removing a stack of the first metal layer, the second metal layer and the third metal layer, and wherein the partially removing the stack of the first metal
layer, the second metal layer and the third metal layer
comprises using the etching material comprising fluo-
rine (F).

22. The method of claim 21, wherein after the first
auxiliary hole and the second auxiliary hole are formed, a
first contact assist portion and a second contact assist portion
of the second semiconductor material layer which are
exposed through the first auxiliary hole and the second
auxiliary hole, respectively, are in contact with the etching
material and become conductive.

23. The method of claim 22, wherein the electrode con-
ductive layer comprises a gate electrode overlapping a part
of a central portion of the second semiconductor material
layer, a source electrode overlapping one side of the second
semiconductor material layer, and a drain electrode over-
lapping an opposite side of the second semiconductor mate-
rial layer, wherein the source electrode is in contact with the first
    contact assist portion of the second semiconductor
    material layer through the first auxiliary hole, and
  wherein the drain electrode is in contact with the second
    contact assist portion of the second semiconductor
    material layer through the second auxiliary hole.

24. The method of claim 23, wherein the forming the
active layer comprises: making conductive remaining parts
of the second semiconductor material layer which are not
covered with the gate insulating layer, wherein the active layer comprises a channel region
    overlapping the gate electrode, a source region in
    contact with one side of the channel region, and a drain
    region in contact with an opposite side of the channel
    region,
  wherein the source region comprises the first contact
    assist portion, and
  wherein the drain region comprises the second contact
    assist portion.

25. The method of claim 23, further comprising:

disposing a buffer layer covering a light-blocking con-
  ductive layer on the substrate prior to the disposing the
  first semiconductor material layer; and
disposing an interlayer dielectric layer covering the elec-
  trode conductive layer and the active layer after the
  forming the active layer,
wherein the active layer comprises a first gap area
  between the source electrode and the gate electrode,
  and a second gap area between the drain electrode and
  the gate electrode, and
wherein entire of the first gap area and entire of the second
  gap area are in contact with the interlayer dielectric
  layer and disposed between the interlayer dielectric
  layer and the buffer layer.

* * * * *